United States Patent
Akita et al.

(10) Patent No.: US 7,955,881 B2
(45) Date of Patent: Jun. 7, 2011

(54) METHOD OF FABRICATING QUANTUM WELL STRUCTURE

(75) Inventors: Katsushi Akita, Itami (JP); Takamichi Sumitomo, Itami (JP); Yohei Enya, Itami (JP); Takashi Kyono, Itami (JP); Masaki Ueno, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 162 days.

(21) Appl. No.: 12/500,074

(22) Filed: Jul. 9, 2009

(65) Prior Publication Data

US 2010/0009484 A1     Jan. 14, 2010

(30) Foreign Application Priority Data

Jul. 9, 2008   (JP) ................ P2008-179491

(51) Int. Cl.
    *H01L 21/00*    (2006.01)
(52) U.S. Cl. ............... 438/46; 438/22; 438/25; 438/35; 438/47; 257/14; 257/15; 257/18; 257/20; 257/24; 257/E21.108
(58) Field of Classification Search .......... None
    See application file for complete search history.

(56) References Cited

U.S. PATENT DOCUMENTS

2005/0067613 A1*  3/2005  Kim ................. 257/14
2005/0199903 A1   9/2005  Kyono et al.
2006/0268953 A1   11/2006 Ikedo et al.
2007/0012932 A1   1/2007  Kobayakawa et al.

FOREIGN PATENT DOCUMENTS

| JP | 2002-043618 |   | 2/2002 |
| JP | 2006-210692 | A | 8/2006 |
| JP | 2006-237281 | A | 9/2006 |
| JP | 2006-332258 | A | 12/2006 |
| JP | 2008-118049 | A | 5/2008 |

* cited by examiner

*Primary Examiner* — N Drew Richards
*Assistant Examiner* — Kyoung Lee
(74) *Attorney, Agent, or Firm* — Venable LLP; Michael A. Sartori; Steven J. Schwarz

(57) ABSTRACT

In the method of fabricating a quantum well structure which includes a well layer and a barrier layer, the well layer is grown at a first temperature on a sapphire substrate. The well layer comprises a group III nitride semiconductor which contains indium as a constituent. An intermediate layer is grown on the InGaN well layer while monotonically increasing the sapphire substrate temperature from the first temperature. The group III nitride semiconductor of the intermediate layer has a band gap energy larger than the band gap energy of the InGaN well layer, and a thickness of the intermediate layer is greater than 1 nm and less than 3 nm in thickness. The barrier layer is grown on the intermediate layer at a second temperature higher than the first temperature. The barrier layer comprising a group III nitride semiconductor and the group III nitride semiconductor of the barrier layer has a band gap energy larger than the band gap energy of the well layer.

8 Claims, 18 Drawing Sheets

Fig.1
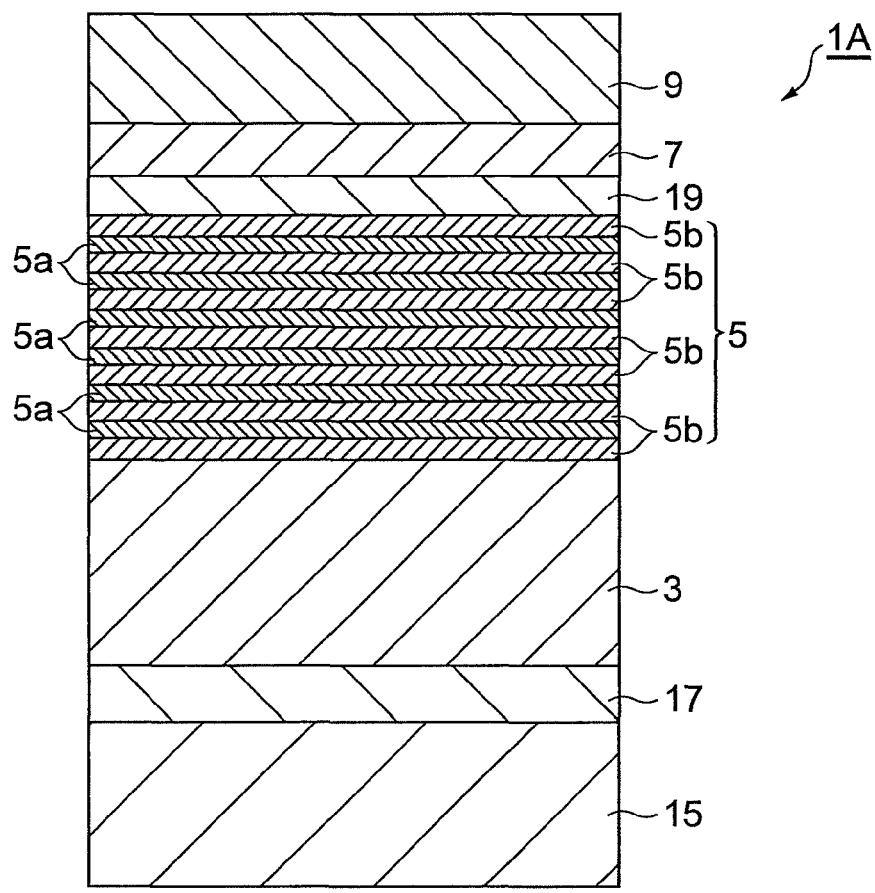
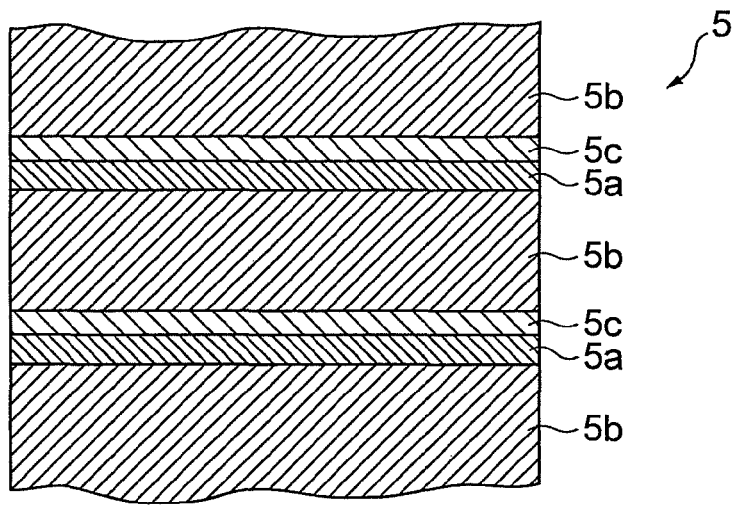

Fig.3
(a)
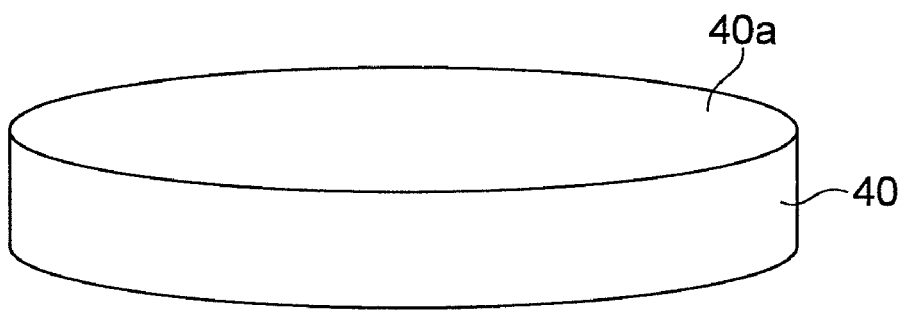
(b)
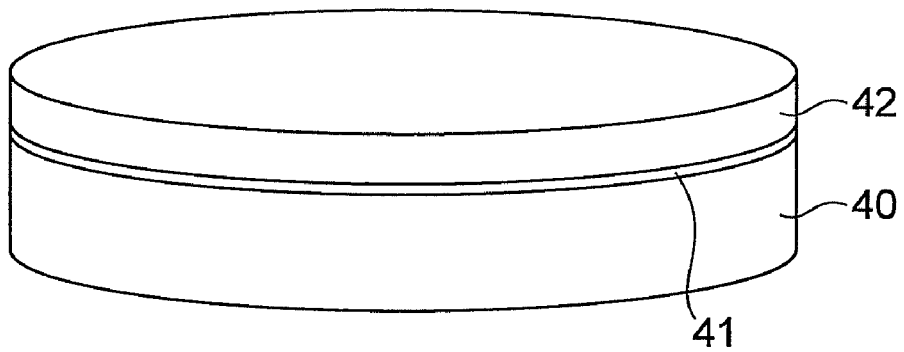

Fig.4
(a)
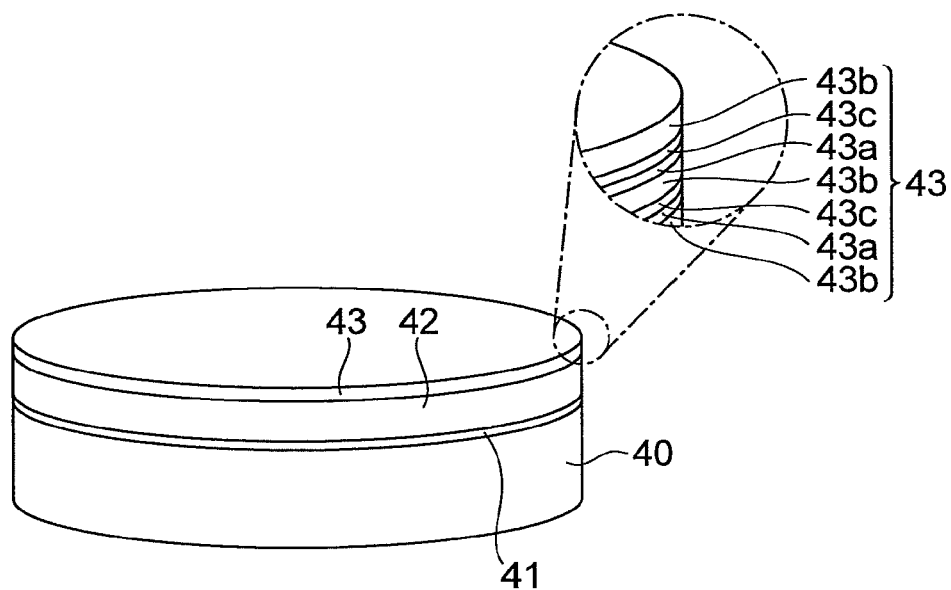
(b)
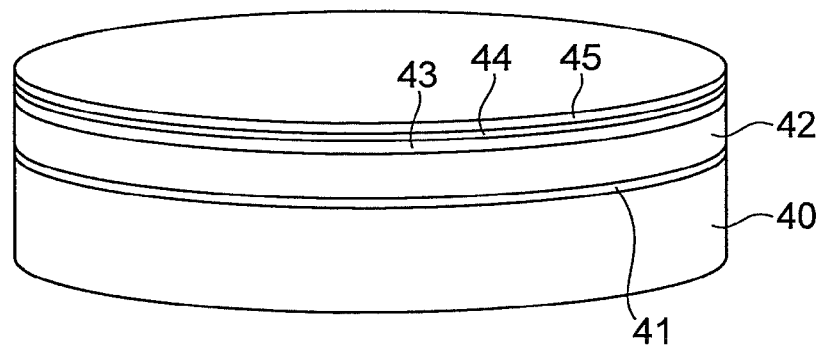

*Fig.12*
(a)
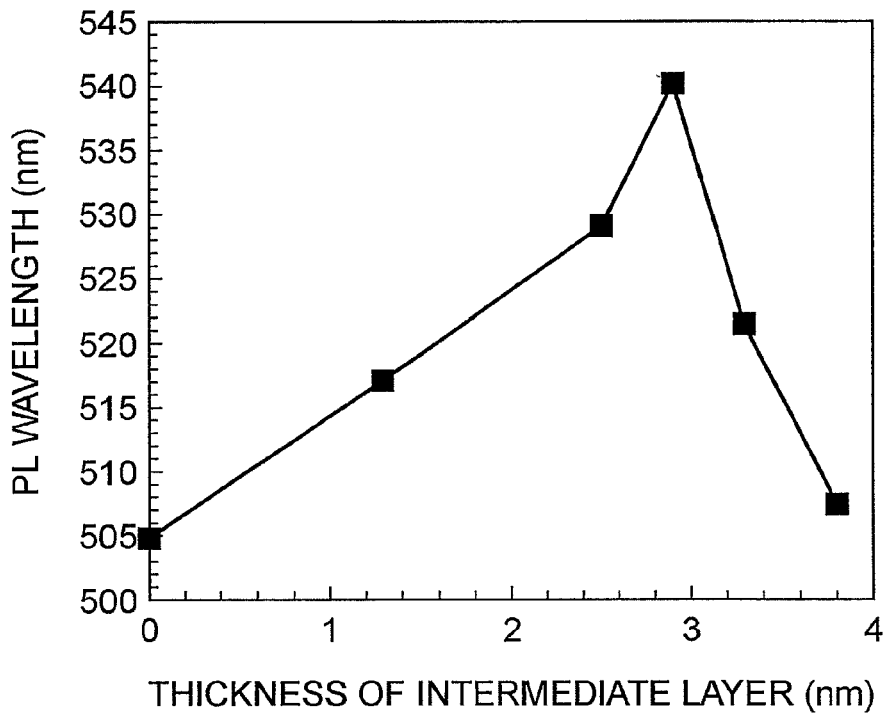
(b)
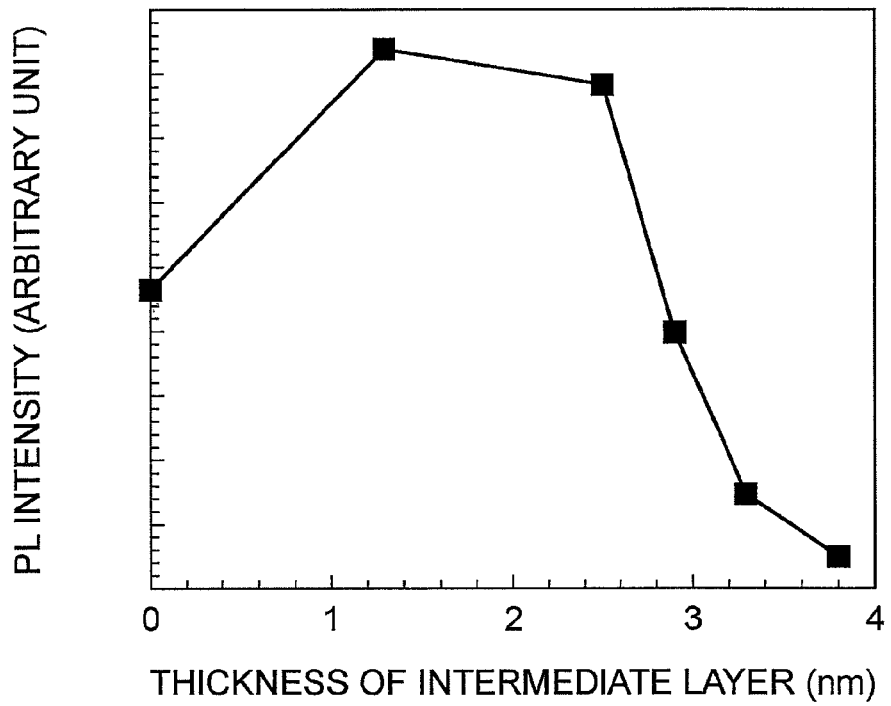

Fig.14
(a)
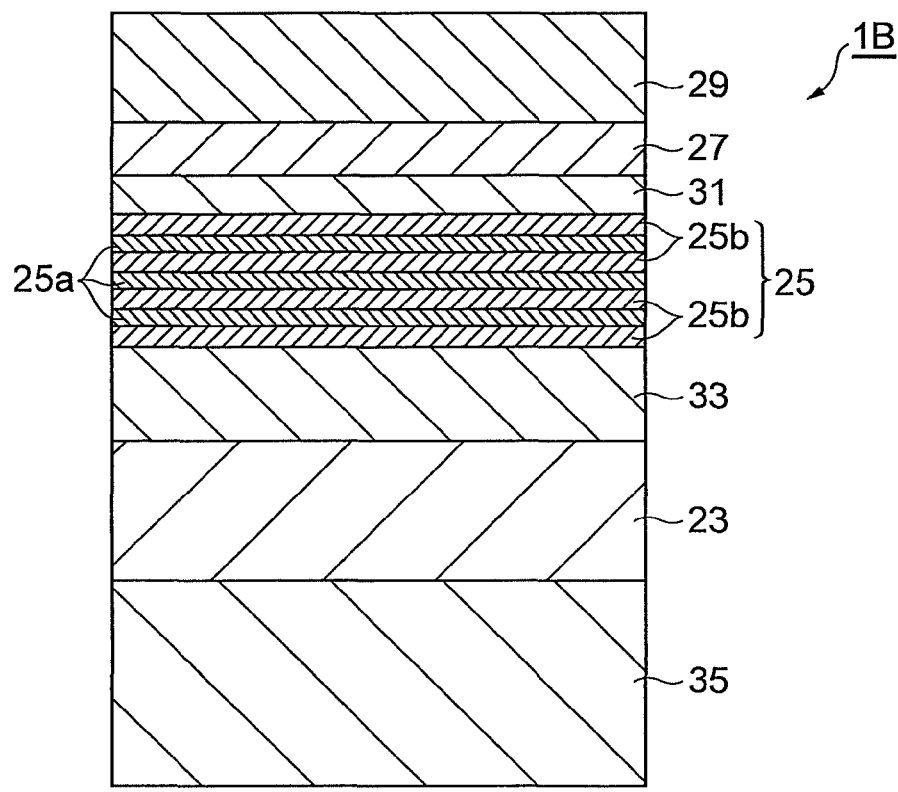
(b)
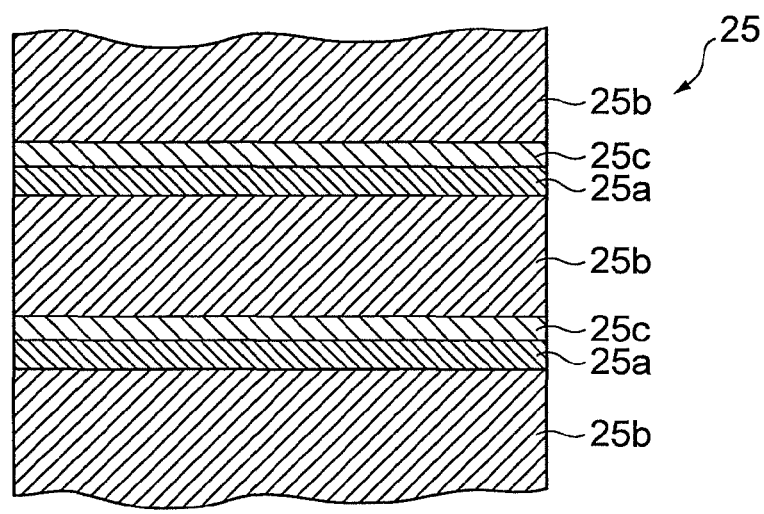

Fig.16
(a)
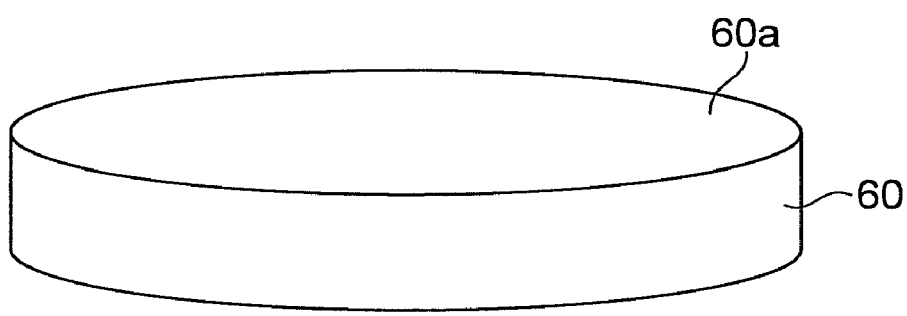
(b)
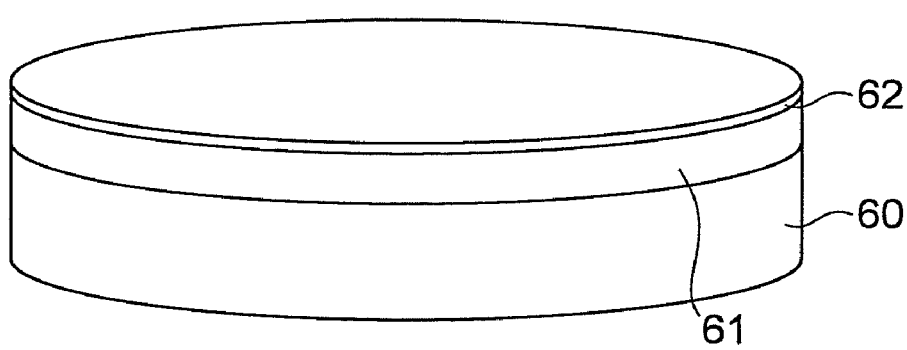

Fig.17
(a)
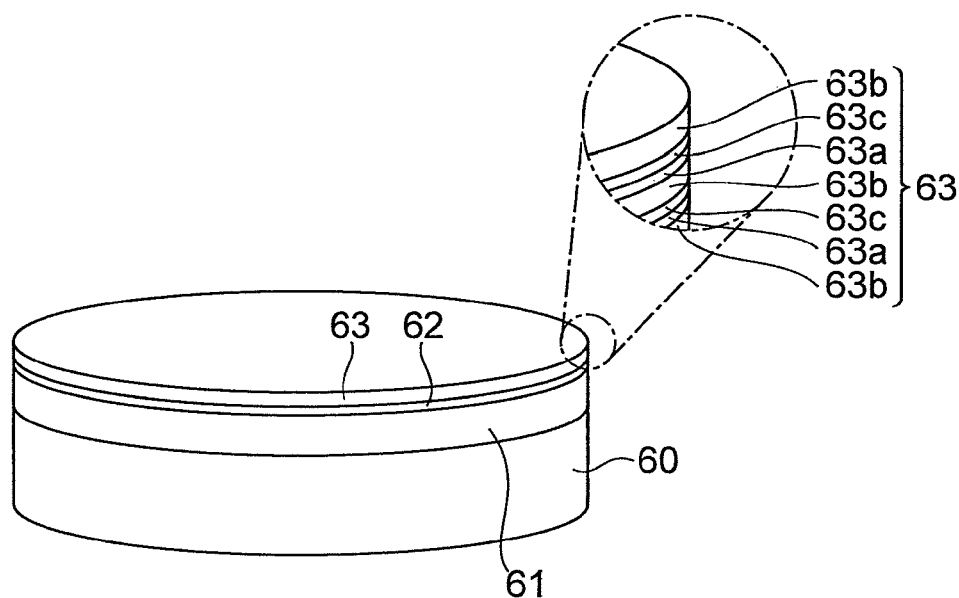
(b)
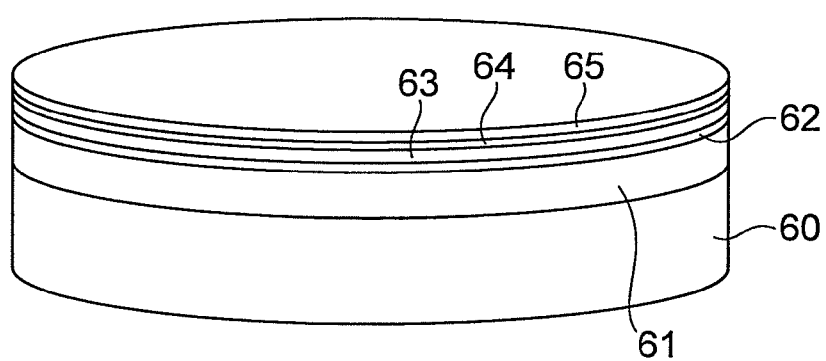

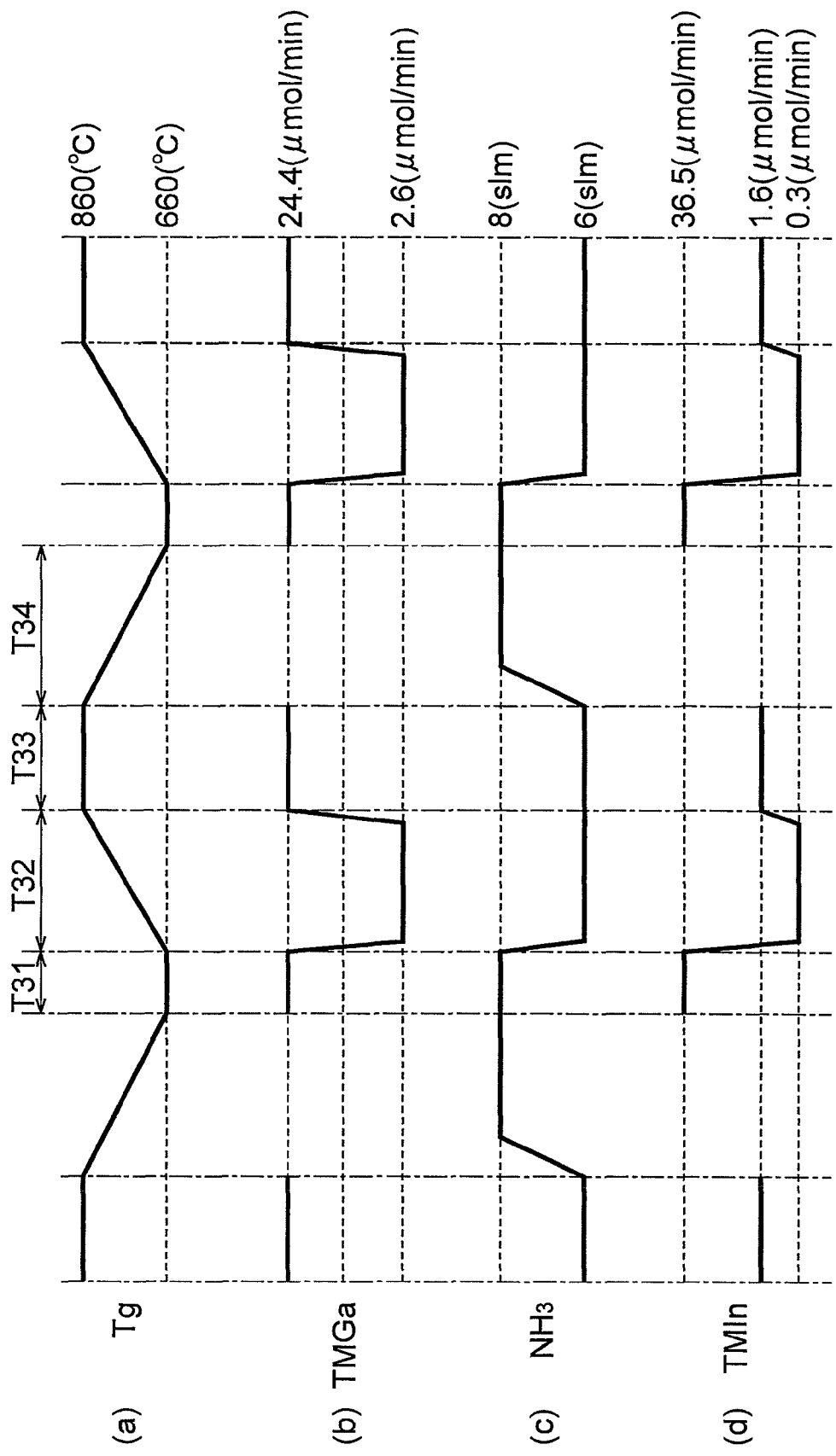

METHOD OF FABRICATING QUANTUM WELL STRUCTURE

BACKGROUND OF THE INVENTION

1. Technical Field

The present invention relates to a method of fabricating a quantum well structure.

2. Related Background Art

Patent publication 1 (Japanese Unexamined Patent Application Publication No. 2002-043618) discloses a method of fabricating a multiple-quantum-well structure on a substrate. In this method, the structure includes well layers and barrier layers which are alternately arranged. The well layers are composed of nitride semiconductor, and the barrier layers are composed of nitride semiconductor. The barrier layers have a band gap energy larger than that of the well layers. In the method of Patent publication 1, the following steps are repeated: growing a well layer at a substrate temperature of a first temperature; growing a barrier layer while the substrate temperature is increased from the first temperature to a second temperature; further growing the barrier layer at the second temperature; and decreasing the substrate temperature from the second temperature to the first substrate temperature.

SUMMARY OF THE INVENTION

The emission wavelength of group III nitride semiconductor having a quantum well structure depends on the composition of indium contained in a well layer thereof. The quantum well structure in Patent publication 1 is prepared for a blue light emitting diode (LED), and its indium composition of the well layer is relatively low. In order to obtain emission of a longer wavelength, for example, green emission, in a quantum well structure of a group III nitride semiconductor, the indium composition of the well layer, however, needs to be increased.

In a group III nitride semiconductor containing indium as a constituent, a high temperature facilitates the decomposition of the semiconductor crystal of a higher indium content. In the formation of a quantum well structure, however, a substrate temperature is often increased to grow a barrier layer after a well layer has been grown, and during the temperature rise, the crystal structure of the well layer is likely to be decomposed. Such decomposition will impair emission properties of the well layer, resulting in lower emission intensity or shift toward shorter wavelengths, for example.

To address the above problems, Patent publication 1 proposes a method in which a barrier layer is grown while increasing the substrate temperature. Unfortunately, in the method described in Patent publication 1, an additional portion for the barrier layer is grown on the underlying layer for the barrier layer at the increased temperature to form the barrier layer. Accordingly, the barrier layer is grown into a relatively large thickness, and thus the additional portion of the barrier layer has poor crystal quality, which makes it difficult to achieve the desired emission properties corresponding to the indium content of the well layer.

The present invention was made in view of the above problems, and it is an object of the present invention to provide a method of fabricating a quantum well structure comprising an indium-containing group III nitride semiconductor, and the method can prevent the III nitride semiconductor from decomposing and provide the quantum well structure having emission properties corresponding to the indium content thereof.

One aspect of the present invention provides, to solve the above problems, a method of fabricating a quantum well structure on a substrate. The present method comprises the steps of: (a) growing the well layer at a first temperature on a substrate, the well layer comprising a group III nitride semiconductor, and the group III nitride semiconductor containing indium as a constituent; (b) growing an intermediate layer on the well layer while monotonically increasing a substrate temperature from the first temperature, the intermediate layer comprising a group III nitride semiconductor, the group III nitride semiconductor of the intermediate layer having a band gap energy larger than that of the well layer, and a thickness of the intermediate layer being greater than 1 nm and less than 3 nm in thickness; and (c) growing the barrier layer on the intermediate layer while keeping the substrate temperature at a second temperature higher than the first temperature, the barrier layer comprising a group III nitride semiconductor, and the group III nitride semiconductor of the barrier layer having a band gap energy larger than the band gap energy of the well layer.

The first method of fabricating a quantum well structure includes the intermediate layer growth step between the well layer growth step and the barrier layer growth step, and the intermediate layer includes a group III nitride semiconductor having a band gap energy larger than the band gap energy of the well layer. In the intermediate layer growth step, the intermediate layer is grown while the substrate temperature of the first temperature is monotonically; increased. The intermediate layer protects the well layer in the subsequent barrier layer growth step, which suppresses the decomposition of the crystal structure of the well layer even when the substrate is subjected to atmosphere of a higher temperature, such as the second temperature, in the barrier layer growth step. The inventors have found as follows: an intermediate layer having a thickness not greater than 1 nm does not adequately protect the well layer and may cause the decomposition of the crystal, resulting in the degradation of emission properties of the well layer; since the intermediate layer is grown at a relatively low temperature, the intermediate layer having a thickness of 3 nm or more causes undesired crystal quality of the barrier layer that is to be grown thereon and precludes the achievement of the emission properties of the well layer corresponding to the indium content of the well layer. Thus, according to the present method of fabricating a quantum well structure, since an intermediate layer having a thickness greater than 1 nm and less than 3 nm is grown in the intermediate layer growth step, the intermediate layer can suppress the decomposition of the semiconductor crystal of the well layer and achieve the emission properties corresponding to the indium content of the well layer.

In the first method of fabricating a quantum well structure, the intermediate layer may be grown at a growth rate lower than the growth rate for the barrier layer. Since the intermediate layer is grown at a relatively low growth temperature, the thickness of the intermediate layer that may have a low crystal quality is made further reduced.

Another aspect of the present invention provides a second method of fabricating a quantum well structure on a substrate, and the quantum well structure includes a well layer and a barrier layer. The method comprises the steps of: (a) growing the well layer on a substrate while keeping a substrate temperature at a first temperature, the well layer comprising a group III nitride semiconductor, and the group III nitride semiconductor containing indium as a constituent; (b) growing a first portion of an intermediate layer on the well layer while monotonically increasing the substrate temperature from the first temperature, the first portion of the intermediate layer comprising a group III nitride semiconductor, and the group III nitride semiconductor of the first portion of having a band gap energy larger than that of the well layer; (c) after interrupting the growth of the intermediate layer, increasing the substrate temperature without semiconductor growth following the growth of the first portion of the intermediate layer; (d) after increasing the substrate temperature without semiconductor growth, growing a second portion of the intermediate layer on the first portion of the intermediate layer while increasing the substrate temperature to a second temperature higher than the first temperature, a thickness of the intermediate layer being greater than 1 nm and less than 3 nm in total thickness; and (e) growing the barrier layer on the second portion of the intermediate layer while keeping the substrate temperature at the second temperature, the barrier layer comprising a group III nitride semiconductor, and the group III nitride semiconductor of the barrier layer having a band gap energy larger than that of the well layer.

The second method of fabricating a quantum well structure includes the first intermediate layer growth step, the temperature rise step, and the second intermediate layer growth step, and the first intermediate layer growth step is provided between the well layer growth step and the barrier layer growth step. In the first and second intermediate layer growth steps, the intermediate layer is grown while the temperature substrate is gradually increased from a first temperature. Since the intermediate layer is grown over the well layer, it protects the well layer by suppressing the decomposition of the crystal of the well layer even when the substrate temperature is increased to a higher temperature (the second temperature). In the second intermediate layer growth step after the temperature rise step, the remaining portion of the intermediate layer is grown at a relatively high temperature, whereby the crystal qualities of the intermediate layer and the barrier layer thereon are both improved. In addition, according to the second method of fabricating a quantum well structure, the intermediate layer is formed into a total thickness greater than 1 nm and less than 3 nm as in the first method to avoid the decomposition of crystal and achieve the emission properties corresponding to the indium content of the well layer.

In the second method of fabricating a quantum well structure, the intermediate layer may be grown in the second the intermediate layer growth step at a growth rate lower than the growth rate for the barrier layer in the barrier layer growth step. Since the first portion of the intermediate layer is grown at a relatively low substrate temperature, the thickness of the first portion that has a low crystal quality is made further reduced.

In the first and second methods each of fabricating a quantum well structure, the well layer may have an emission wavelength of 500 nm or more. The first and second methods of fabricating a quantum well structure are favorably applied to a quantum well structure having an emission wavelength longer than in a wavelength region of green color.

In the first and second fabricating methods, the substrate may comprise an $In_S Al_T Ga_{1-S-T} N$ semiconductor ($0 \leq S \leq 1$, $0 \leq T \leq 1$, $0 \leq S+T \leq 1$).

BRIEF DESCRIPTION OF THE DRAWINGS

FIG. 1 is a schematic side view of a semiconductor light emitting device and an active layer thereof according to a first embodiment of the present invention.

FIG. 3 is a schematic view for the steps in FIG. 2.

FIG. 4 is a schematic view for the steps in FIG. 2.

FIG. 12 is a graph showing the relationship between the peak wavelength of PL spectra and the thickness of an intermediate layer and the relationship between the PL intensity and the thickness of an intermediate layer.

FIG. 14 is a schematic side view of a semiconductor light emitting device and an active layer thereof according to a third embodiment of the present invention.

FIG. 16 is a schematic view for the steps in FIG. 15.

FIG. 17 is a schematic view for the steps in FIG. 15.

FIG. 18 is a graph showing as follows: change "(a)" of the temperature of an n-type GaN substrate (substrate temperature Tg) in forming an active layer; change "(b)" of the amount of supplied TMGa; change "(c)" of the amount of supplied $NH_3$; and change "(d)" of the amount of supplied TMIn.

DESCRIPTION OF THE PREFERRED EMBODIMENTS

Figure 2:
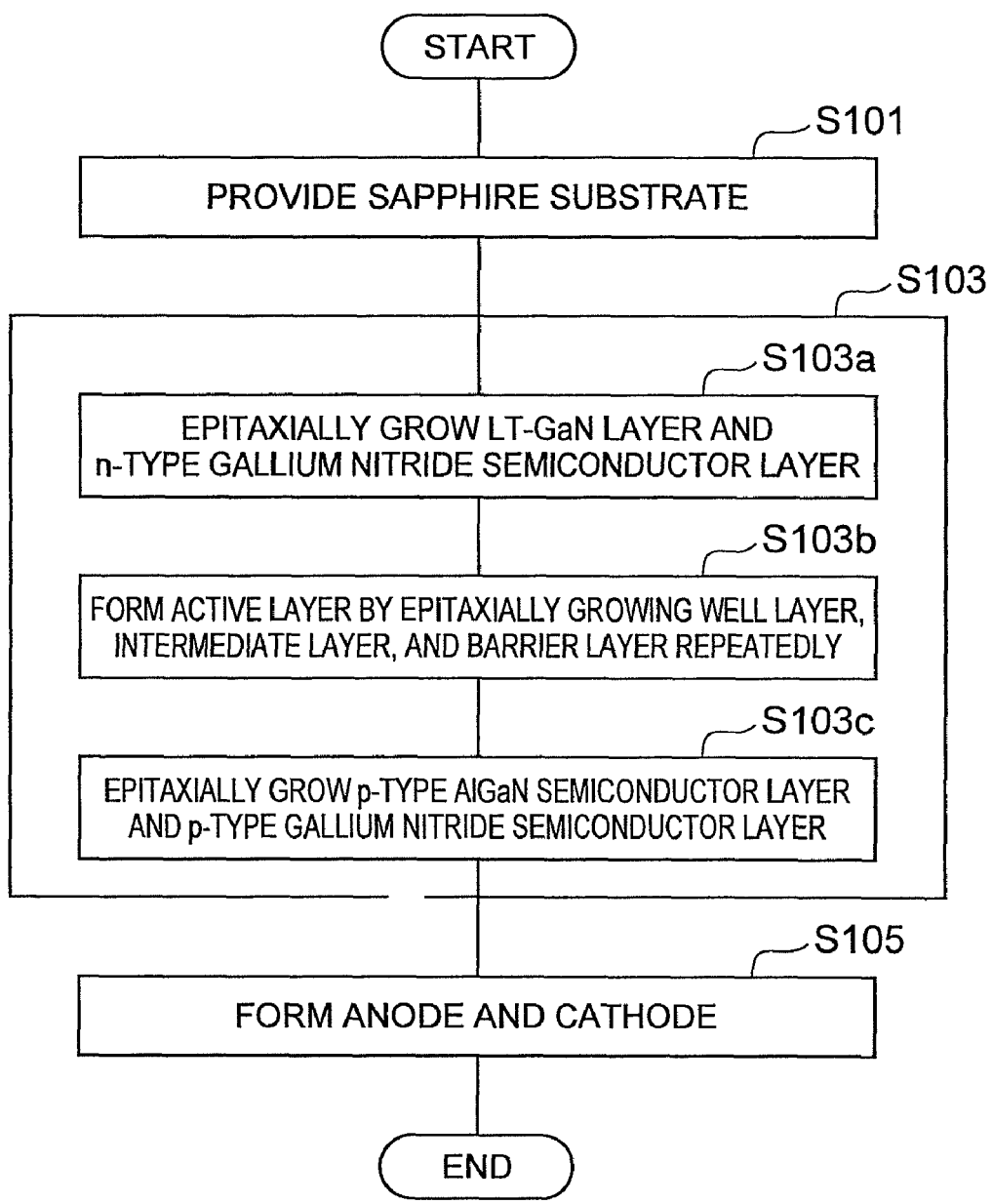
FIG. 2 is a flowchart showing the primary steps of a method of fabricating the semiconductor light emitting device according to the first embodiment.

Embodiments of a method of fabricating a quantum well structure, a quantum well structure, and a semiconductor light emitting device according to the present invention will be described below with reference to the drawings. The same reference numerals refer to the same parts throughout the drawings wherever possible.

First Embodiment

Part (a) of FIG. 1 is a schematic sectional side view of a configuration of a semiconductor light emitting device 1A according to a first embodiment of the present invention. The semiconductor light emitting device 1A may be a surface-emitting diode. In one example, the semiconductor light emitting device 1A may be a device (semiconductor chip) having a square top of 400 micrometers×400 micrometers as viewed in the direction of its thickness from directly above, i.e., in the top plan view. The semiconductor light emitting device 1A comprises an n-type gallium nitride based semiconductor layer 3, an active layer 5 including indium (In)-containing group III nitride semiconductor layers, a p-type AlGaN semiconductor layer 7, and a p-type gallium nitride based semiconductor layer 9, which form a semiconductor laminate. The active layer 5 is provided on the n-type gallium nitride based semiconductor layer 3. The p-type AlGaN semiconductor layer 7 is provided on the active layer 5. The p-type gallium nitride based semiconductor layer 9 is provided on the p-type AlGaN semiconductor layer 7. The n-type gallium nitride based semiconductor layer 3 is partially exposed in the semiconductor laminate as viewed from directly above the semiconductor light emitting device 1A, i.e., in the top plan view, and an electrode (e.g., cathode) is formed on the exposed part of the n-type gallium nitride based semiconductor layer 3. Another electrode (e.g., anode) is provided on the p-type gallium nitride based semiconductor layer 9.

The n-type gallium nitride based semiconductor layer 3 functions as a lower cladding layer, and may be an n-type GaN semiconductor layer having a thickness of 5000 nm, for example. The p-type AlGaN semiconductor layer 7 functions as an electron blocking layer that reduces electron leakage from the active layer 5 and enhances quantum efficiency. The p-type AlGaN semiconductor layer 7 has a thickness of 20 nm, for example. The p-type gallium nitride based semiconductor layer 9 functions as a contact layer for electrical connection to the electrode, and may be a p-type GaN semiconductor layer having a thickness of 50 nm, for example.

The semiconductor light emitting device 1A further includes a sapphire substrate 15 having a primary surface 15a. A low-temperature-grown LT-GaN layer 17 is formed on the primary surface 15a of the sapphire substrate 15. The n-type gallium nitride based semiconductor layer 3 is provided on the LT-GaN layer 17. The LT-GaN layer 17 has a thickness of 25 nm, for example.

The active layer 5 has a quantum well structure with well layers 5a and barrier layers 5b. The well layers 5a are composed of a group III nitride semiconductor containing indium (In) as a constituent, and may be composed of $In_YGa_{1-Y}N$ ($0<X<1$), for example. The well layers 5a have an emission wavelength of 500 nm or more, for example. The barrier layers 5b are composed of a group III nitride semiconductor having a band gap energy larger than that of the well layers 5a, and may be composed of $In_YGa_{1-Y}N$ ($0 \leq Y<1, Y<X$) containing less indium content than the well layer 5a. The barrier layers 5b may be composed of GaN if necessary. In an excellent example, each well layer 5a has a thickness equal to or less than 10 nm, and its thickness can be 3 nm, and each barrier layer 5b has a thickness larger than that of the well layer 5a, and its thickness may be 12.5 nm. The active layer 5 emits light through the electrode on the p-type gallium nitride based semiconductor layer 9.

The semiconductor light emitting device 1A further includes a gallium nitride based layer 19, which can be composed of GaN grown under nitrogen atmosphere and interposed between the active layer 5 and the p-type AlGaN semiconductor layer 7. The gallium nitride layer 19 has a thickness of 3 nm, for example.

Part (b) of FIG. 1 is a cross sectional view showing the active layer 5 of this embodiment in more detail. As shown in part (b) of FIG. 1, the active layer 5 has a multiple quantum well structure, which has well layers 5a and barrier layers 5b arranged alternately. The active layer 5 further has intermediate layers 5c between the well layers 5a and the barrier layers 5b. The active layer 5 of this embodiment has a number of units each of which has a well layer 5a, an intermediate layer 5c, and a barrier layer 5b. These units arranged in sequence to form semiconductor laminate. The intermediate layers 5c are composed of a group III nitride based semiconductor having a band gap energy larger than that of the well layers 5a, and may be composed of $In_ZGa_{1-Z}N$ ($0 \leq Z<1$), for example. Each intermediate layer 5c preferably has a thickness greater than 1 nm and less than 3 nm, and its thickness may be 2.5 nm, for example.

FIG. 2 is a flowchart illustrating the primary steps of a method of fabricating the semiconductor light emitting device 1A according to this embodiment. FIGS. 3 and 4 illustrate the steps in FIG. 2. First, at Step S101 in FIG. 2, as shown in part (a) of FIG. 3, a sapphire substrate 40 having a main surface 40a is prepared. Next, at Step S103, a substrate product such as an epitaxial wafer is fabricated. At Step S103a shown in part (b) of FIG. 3, a low-temperature (LT)-GaN layer 41 and an n-type gallium nitride based semiconductor layer 42 are epitaxially grown on the sapphire substrate 40. The LT-GaN layer 41 has a thickness of 20 nm, and the n-type gallium nitride based semiconductor layer 42 has a thickness of 5000 nm, for example. Preferably the LT-GaN layer 41 is composed of semi-insulating GaN grown at low temperature, and the n-type gallium nitride based semiconductor layer 42 is composed of GaN.

At Step S103b shown in part (a) of FIG. 4, an active layer 43 composed of a group III nitride semiconductor is formed on the n-type gallium nitride based semiconductor layer 42. In this embodiment, a well layer 43a of $In_XGa_{1-X}N$ ($0<X<1$), an intermediate layer 43c of $In_ZGa_{1-Z}N$ ($0 \leq Z<1$), and a barrier layer 43b of $In_YGa_{1-Y}N$ ($0 \leq Y<1, Y<X$) are epitaxially grown repeatedly in sequence on the n-type gallium nitride based semiconductor layer 42 to provide the active layer 43. Each well layer 43a has a thickness that is equal to or smaller than 10 nm, and its thickness may be 3 nm, for example. Each intermediate layer 43c has a thickness greater than 1 nm and less than 3 nm, and its thickness may be 2.5 nm, for example. Each barrier layer 43b has a thickness, for example, 12.5 nm.

At Step S103c, as shown in part (b) of FIG. 4, a p-type AlGaN semiconductor layer 44 and a p-type gallium nitride based semiconductor layer 45 are epitaxially grown on the active layer 43. The p-type AlGaN semiconductor layer 44 may function as an electron blocking layer, whereas the p-type gallium nitride based semiconductor layer 45 may function as a contact layer. The p-type AlGaN semiconductor layer 44 has a thickness of 25 nm, and the p-type gallium nitride based semiconductor layer 45 has a thickness of 50 nm, for example. The p-type gallium nitride based semiconductor layer 45 is composed of GaN, for example. Throughout these steps, an epitaxial wafer is provided.

At Step S105, an electrode (for example, anode) is formed on the p-type gallium nitride based semiconductor layer 45 of the epitaxial wafer. The electrode may be composed of Ni/Au, and has an area of $1.6 \times 10^{-3}$ (cm$^2$), for example. The p-type gallium nitride based semiconductor layer 45, the p-type AlGaN semiconductor layer 44, and the active layer 43 are partially removed by dry etching to expose the n-type gallium nitride based semiconductor layer 42, where another electrode (for example, cathode) is formed. This electrode may be composed of Ti/Al/Au, for example. Finally, the resulting epitaxial wafer is divided into separated chips, which correspond to the semiconductor light emitting devices 1A of this embodiment.

Figure 5:
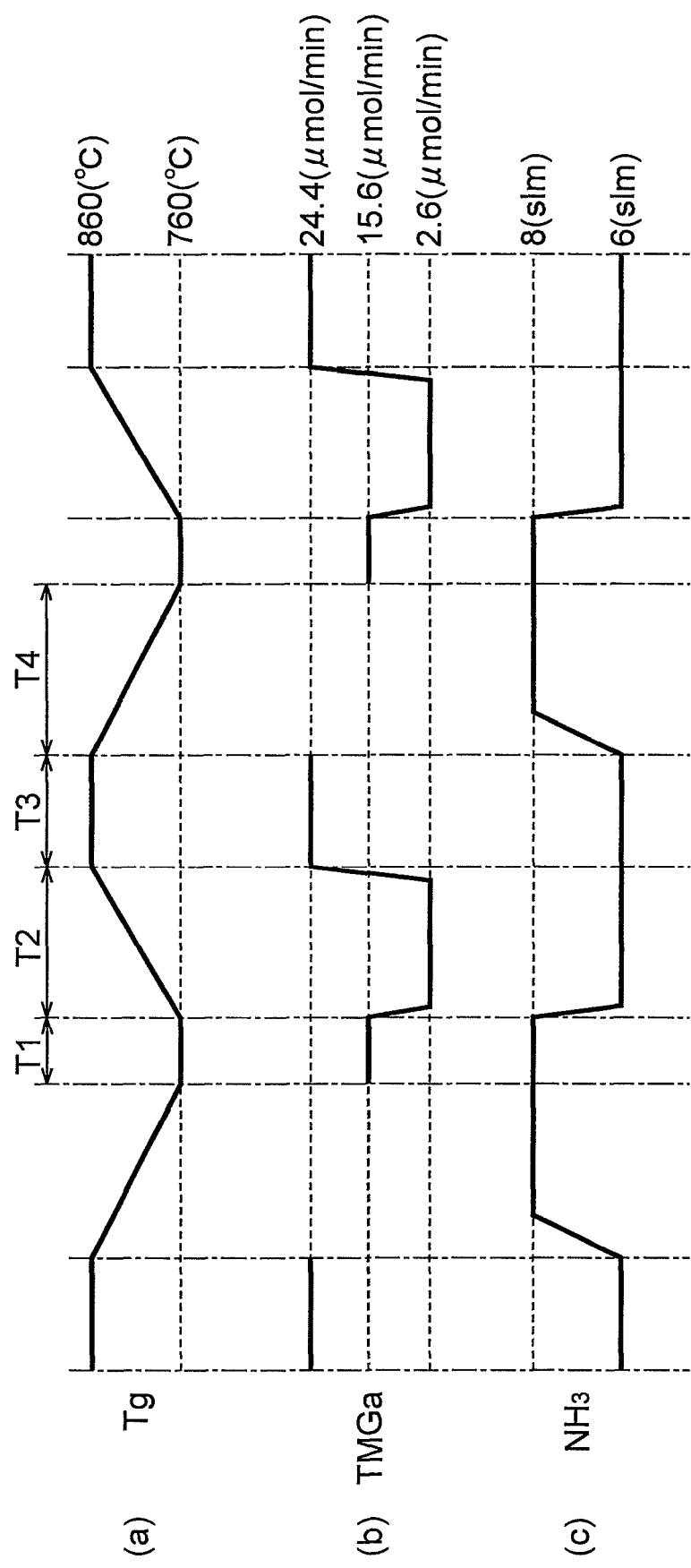
FIG. 5 is a view showing as follows: change "(a)" of the temperature of a sapphire substrate in forming an active layer, change "(b)" of the amount of supplied gallium source gas (trimethylgallium: Toga), and change "(c)" of the amount of supplied nitrogen source gas (ammonia: $NH_3$).

With reference to FIG. 5, a specific example of a method of fabricating a quantum well structure of the active layer 43 will be described in more detail below. FIG. 5 is a graph showing: change "(a)" of the temperature of the sapphire substrate 40 (substrate temperature Tg) in forming the active layer 43; change "(b)" of the amount of supplied gallium source gas (trimethylgallium: TMGa); and change "(c)" of the amount of supplied nitrogen source gas (ammonia: $NH_3$).

During the time period T1 in FIG. 5, InGaN crystal for the well layers 43a is grown. In the step of growing the well layer 43a, the substrate temperature Tg is kept at a relatively low first temperature of 760° C., for example. Such a low temperature assures adequate crystalline characteristics of the InGaN crystal. In the step of growing the well layer 43a, the flow rate $Q_{Ga}$ of TMGa is 15.6 (micromol/minute), the flow rate $Q_V$ of ammonia ($NH_3$) is 8 (slm: standard liter/minute), and the flow rate $Q_{In}$ of TMIn is 58.0 (micromol/minute), for example. The growth rate of the well layer 43a is 0.2 (micrometers/hour), for example.

During the time period T2, the GaN crystals for the intermediate layers 43c are grown. In the step of growing the intermediate layers 43c, the GaN crystal is grown on the well layer 43a while the substrate temperature Tg is gradually increased from the first temperature (e.g., 760° C.) for the growth of the well layer 43a to the second temperature (e.g., 860° C.) for the growth of the barrier layers 43b. In the step of growing the intermediate layers 43c, the flow rate $Q_{Ga}$ of TMGa is 2.6 (micromol/minute), the flow rate $Q_V$ of ammonia ($NH_3$) is 6 (slm: standard liter/minute), for example, and the flow of TMIn is stopped not to supply it. The growth rate of the intermediate layers 43c is lower than that of the barrier layer 43b that will be described below, and is 0.04 micrometers/hour, for example.

During the time period T3, GaN crystal for the barrier layers 43b are grown. In the step of growing the barrier layer 43b, the barrier layer 43b is grown on the intermediate layer 43c whereas the substrate temperature Tg is kept at a relatively high second temperature of 860° C., for example. In the step of growing the barrier layer 43b, the flow rate $Q_{Ga}$ of TMGa is 24.4 (micromol/minute), and the flow rate $Q_V$ of ammonia ($NH_3$) is 6 (slm), for example. The growth rate of the barrier layer 43b is 0.4 (micrometers/hour), for example.

During the time period T4, the substrate temperature Tg is decreased from the second temperature (860° C.) to the first temperature (760° C.). During the temperature fall, the flow of TMGa is stopped not to supply it, and only ammonia ($NH_3$) may be supplied at a flow rate of 8 (slm), for example.

The well layer growth step, the intermediate layer growth step, and the barrier layer growth step are repeated a predetermined number of times, which provides the active layer 43 shown in part (a) of FIG. 4.

Figure 6:
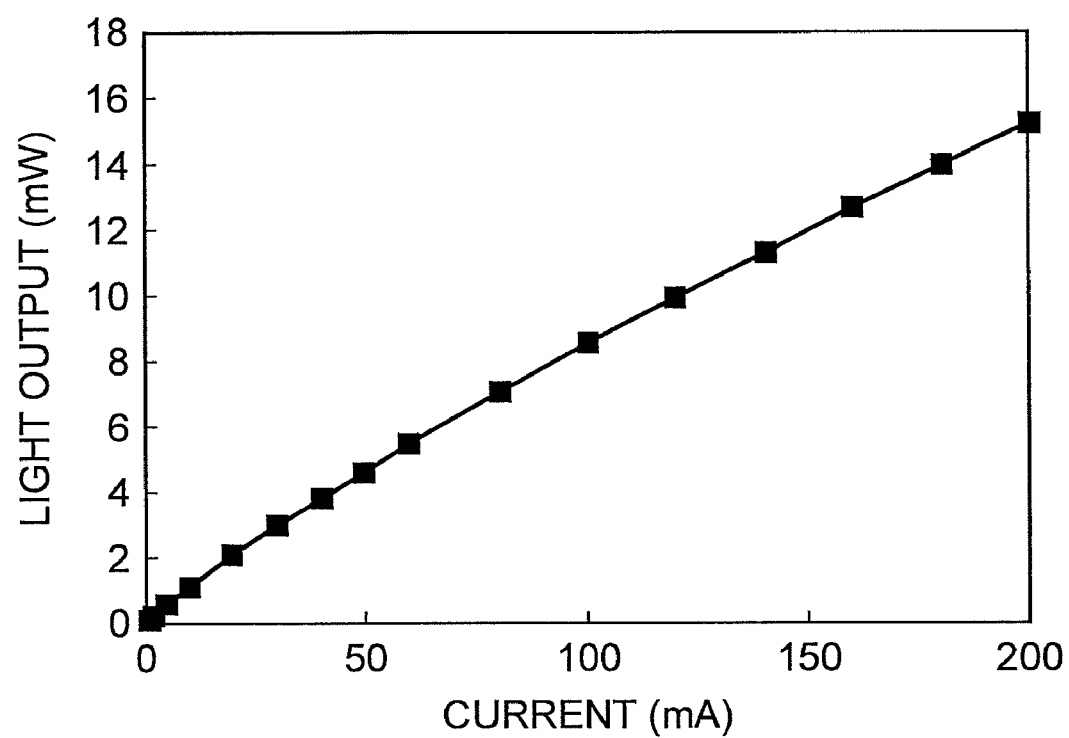
FIG. 6 is a graph showing the optical output characteristics in response to the supply current of the semiconductor light emitting device (bare chip) fabricated by the method of the first embodiment.
Figure 7:
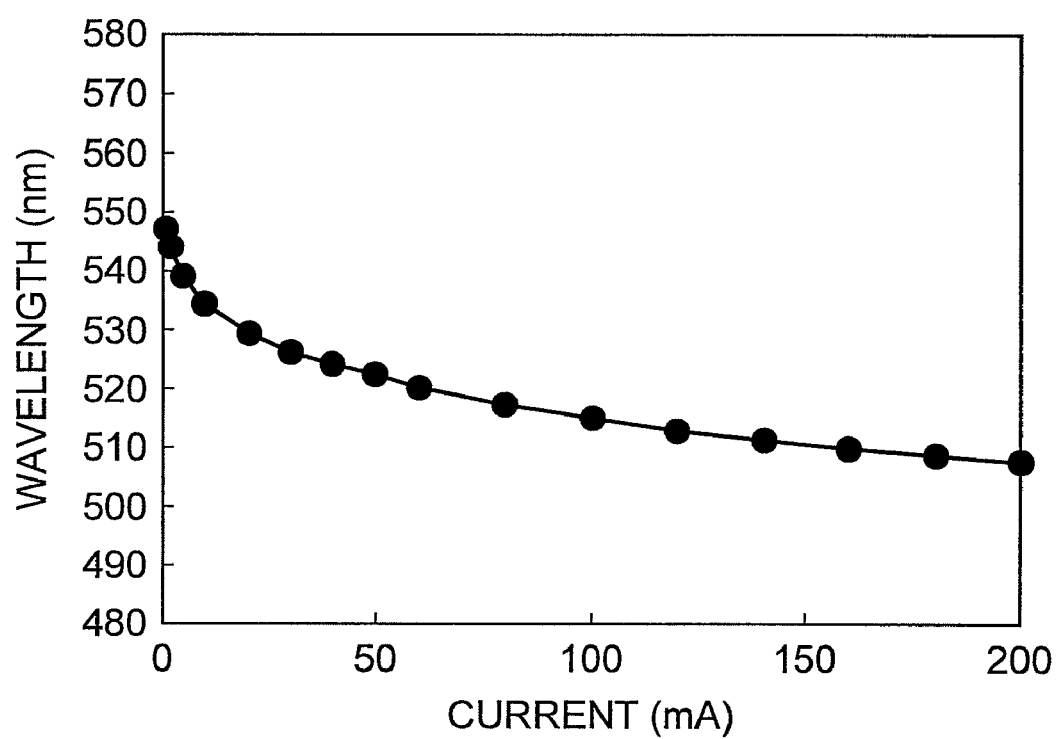
FIG. 7 is a graph showing the emission wavelength characteristics in response to the supply current of the semiconductor light emitting device (bare chip) fabricated by the method of the first embodiment.

FIG. 6 is a graph showing the optical output characteristics in response to the application of current to a semiconductor light emitting device 1A (bare chip) fabricated by the above method. FIG. 7 is a graph showing the emission wavelength characteristics in response to the application of current to a semiconductor light emitting device 1A (separated bare chip) fabricated by the above method. As shown in FIG. 7, the emission wavelength of 530 nm at the supply current of 20 mA corresponds to the optical output of 2.0 mW (external quantum efficiency: 4.2%). The optical output of a lamp device into which the bare chip is molded with epoxy resin is 6.0 mW (external quantum efficiency: 12.6%).

The advantages that the above-described method of fabricating a quantum well structure and the semiconductor light emitting device 1A provides will be described below. The method of fabricating a quantum well structure of this embodiment includes the step of growing the intermediate layer 43c after the step of growing the well layer 43a and before the step of growing the barrier layer 43b. In the step of growing the intermediate layer 43c, the intermediate layer 43c made of group III nitride semiconductor, which has a band gap energy larger than that of the well layer 43a, is grown while the substrate temperature Tg of the sapphire substrate 40 is gradually raised from the first temperature (e.g., 760° C.). The intermediate layer 43c protects the surface of the well layer 43a in the subsequent step of growing the barrier layer 43b, which suppresses the decomposition of crystal of the well layer 43a even when the substrate temperature Tg is changed into a high temperature in the step of growing the barrier layer 43b (to the second temperature of 860° C., for example).

Figure 8:
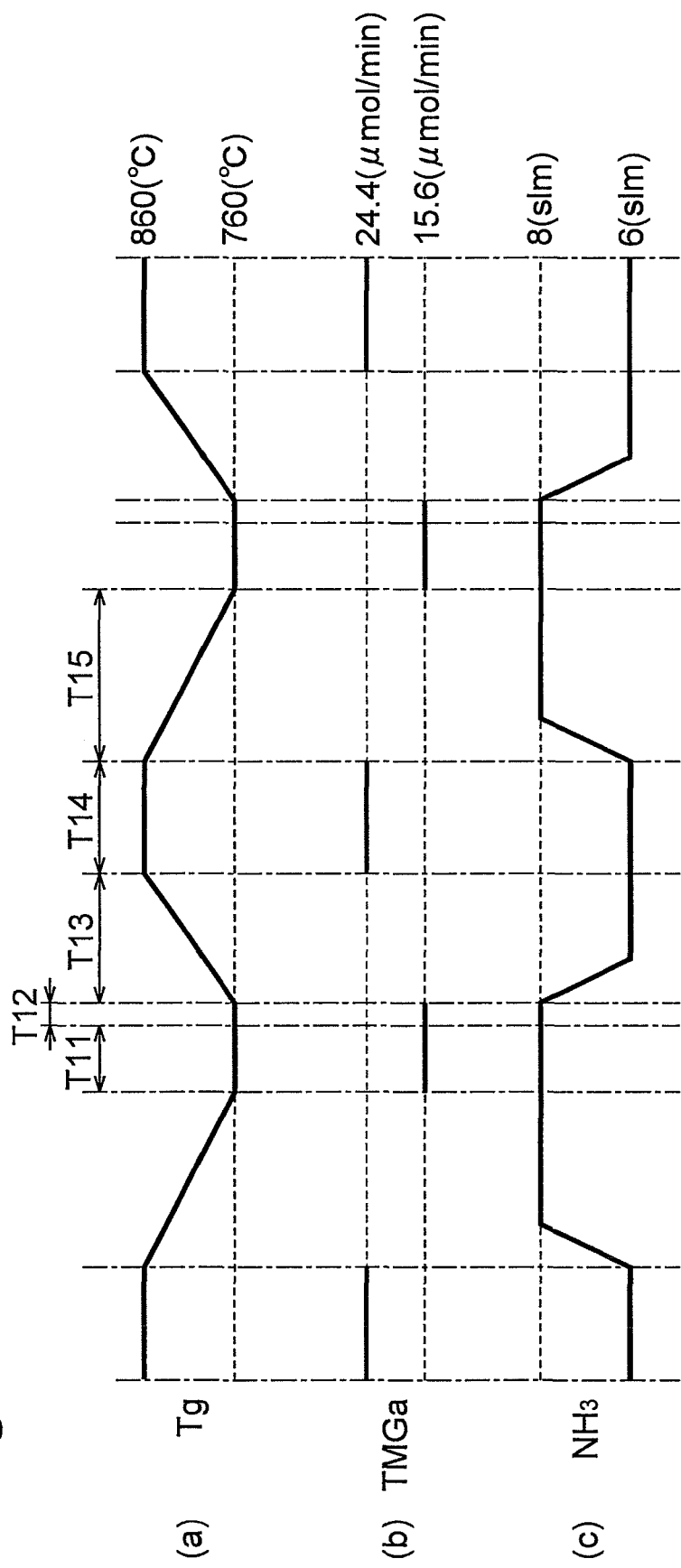
FIG. 8 is a graph showing the following gas flows for a comparative example: change "(a)" of the substrate temperature Tg, change "(b)" of the amount of supplied TMGa; and change "(c)" of the amount of supplied $NH_3$ in a case where the growth of an intermediate layer is interrupted at its thickness of 1 nm and a barrier layer is grown while the substrate temperature Tg is increased.

Experiments conducted by the inventors found that the intermediate layer 43c having a thickness not greater than 1 nm does not adequately protect the well layer 43a and causes decomposition of the semiconductor crystal, leading to degradation of emission properties of the well layer 43a. FIG. 8 is a graph showing the following gas flows in growth of an intermediate layer as a comparative example to the first embodiment: the change "(a)" of the substrate temperature Tg, change "(b)" of the amount of TMGa, and change "(c)" of the amount of $NH_3$. In this growth of an intermediate layer, the growth of an intermediate layer is interrupted when the intermediate layer is grown into a thickness of 1 nm, and then a barrier layer is grown after the substrate temperature Tg has been increased.

Referring to FIG. 8, during the time period T11, InGaN crystal for a well layer is grown. In the step, the substrate temperature Tg is kept at a relatively low temperature, such as 760° C. The flow rate $Q_{Ga}$ of TMGa is 15.6 (micromol/minute), the flow rate $Q_V$ of ammonia ($NH_3$) is 8 (slm), and the flow rate $Q_{In}$ of TMIn is 58.0 (micromol/minute), for example.

During the time period T12, GaN crystal for an intermediate layer are grown. In the step, the substrate temperature Tg is the same as the growth temperature for the well layer (e.g., 760° C.). The flow rate $Q_{Ga}$ of TMGa and the flow rate $Q_V$ of ammonia ($NH_3$) are respectively equal to those for growth of the well layer, and the flow of TMIn is stopped not to supply it. Thus, the GaN crystal for the intermediate layer is grown into 1 nm in thickness.

Subsequently, during time period T13, the supplies of the source gas are stopped except ammonia ($NH_3$), and the substrate temperature Tg is increased from the growth temperature for the well layer (e.g., 760° C.) to a growth temperature for the barrier layer (e.g., 860° C.). During the time period T14, GaN crystal for a barrier layer is grown. In the step, the barrier layer is grown on the intermediate layer, and the substrate temperature Tg is kept at a relatively high temperature of 860° C., for example. The flow rate $Q_{Ga}$ of TMGa is 24.4 (micromol/minute), and the flow rate $Q_V$ of ammonia ($NH_3$) is 6 (slm), for example, and the flow of TMIn is stopped not to supply it. Then, during the time period T15 in FIG. 8, the substrate temperature Tg is decreased from the growth temperature for the barrier layer (860° C.) to the growth temperature for the well layer (760° C.). During the temperature fall, the flow of TMGa and TMIn is stopped not to supply it, and only ammonia ($NH_3$) can be supplied at the flow rate of 8 (slm), for example.

Figure 9:
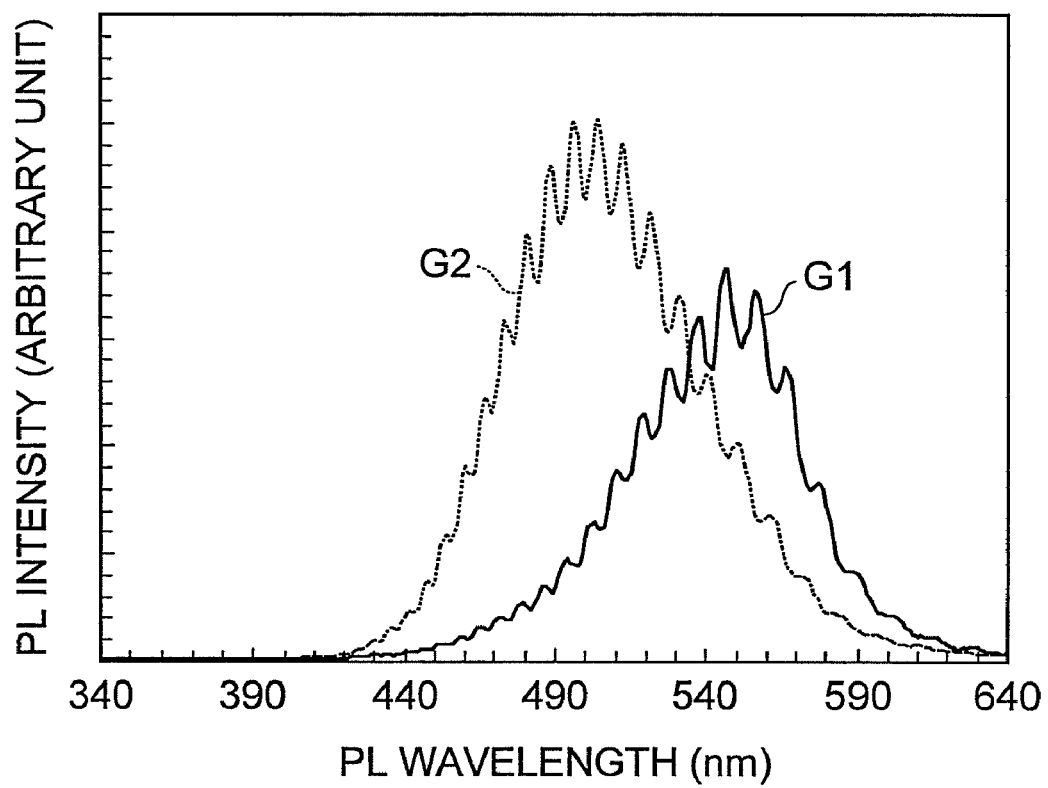
FIG. 9 is a graph showing the comparison between photoluminescence (PL) spectra of the multiple-quantum-well structures.

The comparison between the active layer having the multiple quantum well structure produced by the method shown in FIG. 8 and the active layer having a multiple quantum well structure 43 produced by the method of this embodiment can be summarized as follows. FIG. 9 is a graph showing two photoluminescence (PL) spectra of these multiple-quantum-well structures. In FIG. 9, the characteristic curve G1 indicates the PL spectra by the active layer 43 (the intermediate layer 43c has a thickness of 2.5 nm) of this embodiment; and the characteristic curve G2 indicates the PL spectra by the active layer (the intermediate layer has a thickness of 1 nm) by the method shown in FIG. 8. The horizontal axis in FIG. 9 indicates emission wavelength (nm); and the vertical axis indicates PL intensity (arbitrary unit). As shown in FIG. 9, the multiple quantum well structure (indicated by characteristic curve G1) of this embodiment sufficiently provides a PL spectrum in a wavelength region of 500 nm or more, but the multiple quantum well structure (indicated by characteristic curve G2) by the method shown in FIG. 8 provides a PL spectrum in a shorter PL wavelength region.

Figure 10:
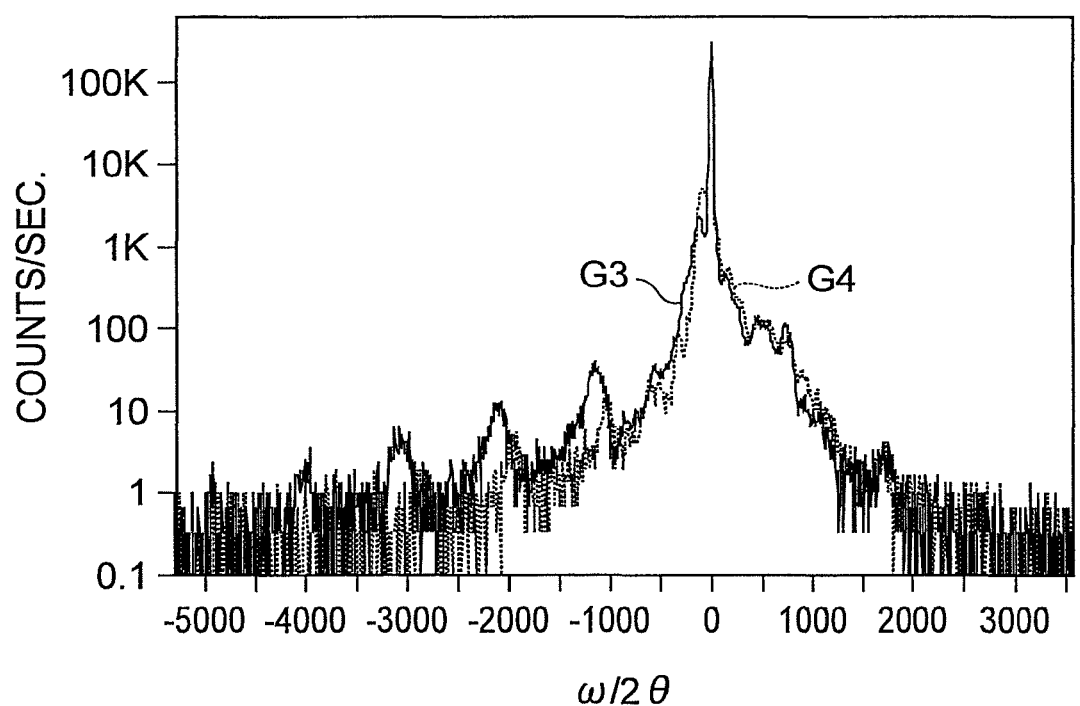
FIG. 10 is a graph showing the result of an X-ray diffractometry (XRD) of the active layer of the multiple quantum well structure fabricated by the method shown in FIG. 8, and the active layer of the multiple quantum well structure fabricated by the method of the first embodiment.

FIG. 10 is a graph showing the results of X-ray diffractometry (XRD) of the active layer having the multiple quantum well structure fabricated by the method shown in FIG. 8 and the active layer having the multiple quantum well structure fabricated by the method of this embodiment. In FIG. 10, the characteristic curve G3 indicates results of the active layer 43 of this embodiment: and the characteristic curve G4 indicates results of the active layer by the method shown in FIG. 8. As shown in FIG. 10, the multiple quantum well structure (indicated by characteristic curve G3) of this embodiment has an excellent periodicity in the arrangement of the well layers 43a and the barrier layers 43b, whereas the multiple quantum well structure (indicated by characteristic curve G4) by the method shown in FIG. 8 exhibits a low periodicity. The shorter PL wavelength of the multiple quantum well structure (FIG. 9) is probably caused by such a less-periodic structure.

Figure 11:
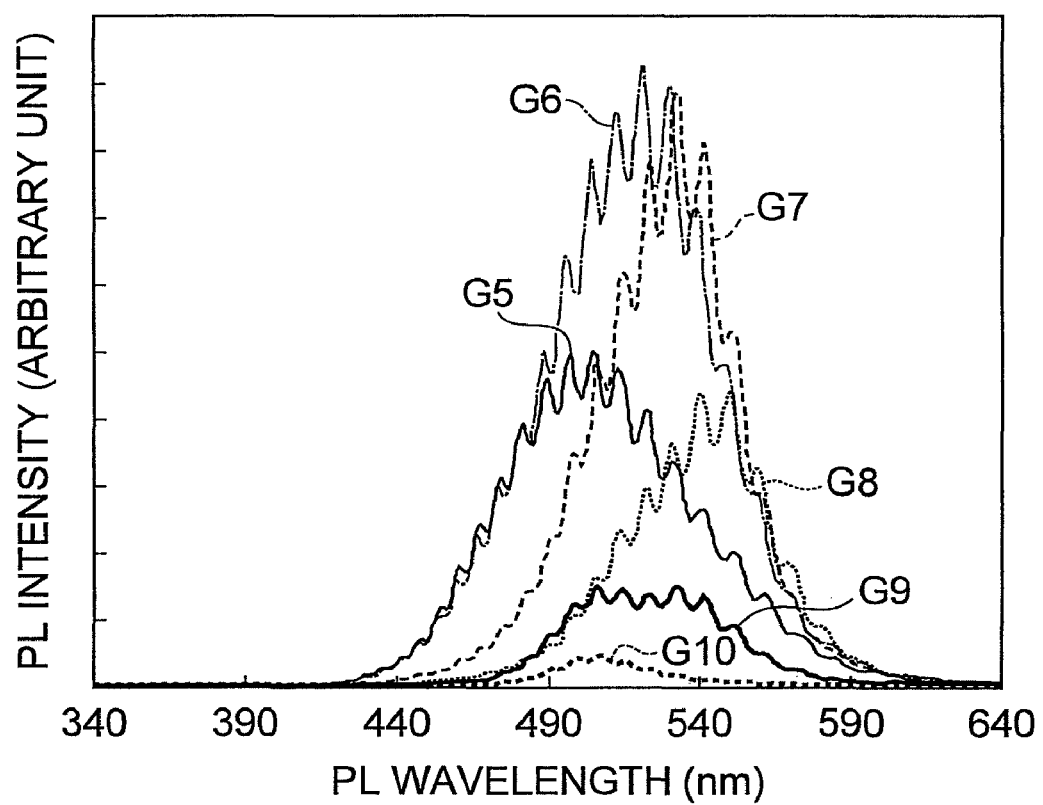
FIG. 11 is a graph showing the relationship between the PL intensity of a well layer and the PL wavelength of an intermediate layer sandwiched between the well layer and a barrier layer.

FIG. 11 is a graph showing the relationship between the PL spectrums with various thickness values of the intermediate layer 43c sandwiched by the well layer 43a and the barrier layer 43b. In FIG. 11, the characteristic curves G5 to G10 show PL spectra for the intermediate layers 43c having the thicknesses of 0 nm, 1.3 nm, 2.5 nm, 2.9 nm, 3.3 nm, and 3.8 nm, respectively. Part (a) of FIG. 12 shows the relationship between the peak wavelength of PL spectra and the thickness of the intermediate layer 43c, and FIG. 12(b) shows the relationship between the PL intensity and thickness of the intermediate layer 43c. As shown in FIG. 11 and part (a) of FIG. 12, without the intermediate layer 43c (characteristic curve G5 in FIG. 11), the less-periodic structure of a multiple quantum well structure results in a shorter PL wavelength, and this PL spectrum is shifted to a shorter wavelength region. To the contrary, in the case of the intermediate layers 43c in a proper thickness range (characteristic curves G6 to G8 in FIG. 11), the larger the thickness of the intermediate layer 43c is, the more the decomposition of semiconductor crystal of the well layer 43a is suppressed, and longer PL wavelengths are provided.

FIG. 11 and part (b) of FIG. 12 demonstrate that the thickness of the intermediate layers 43c is too large (characteristic curves G9 and G10 in FIG. 11) lead to low PL intensities. This is probably because, when the intermediate layers 43c grown at a relatively low temperature have a thickness of 3 nm or more, the crystal quality of the barrier layers 43b on the intermediate layers 43c is not excellent, whereby the emission properties corresponding to the indium content of the well layer 43a are not achieved.

In the method of fabricating a quantum well structure of this embodiment, in the step of growing the intermediate layer 43c, the intermediate layer 43c is grown and its thickness is over 1 nm and less than 3 nm, which effectively prevents crystal of the well layer 43a from decomposing at a high growth temperature for the barrier layer 43b and achieves the emission properties appropriate for the indium content of the well layer 43a.

As in this embodiment, the intermediate layer 43c is preferably grown at a growth rate lower than that for the barrier layer 43b. Although the intermediate layer 43 grown at a relatively low substrate temperature Tg does not have a desired crystal quality, the thickness of the intermediate layer 43c is made reduced.

Second Embodiment

Figure 13:
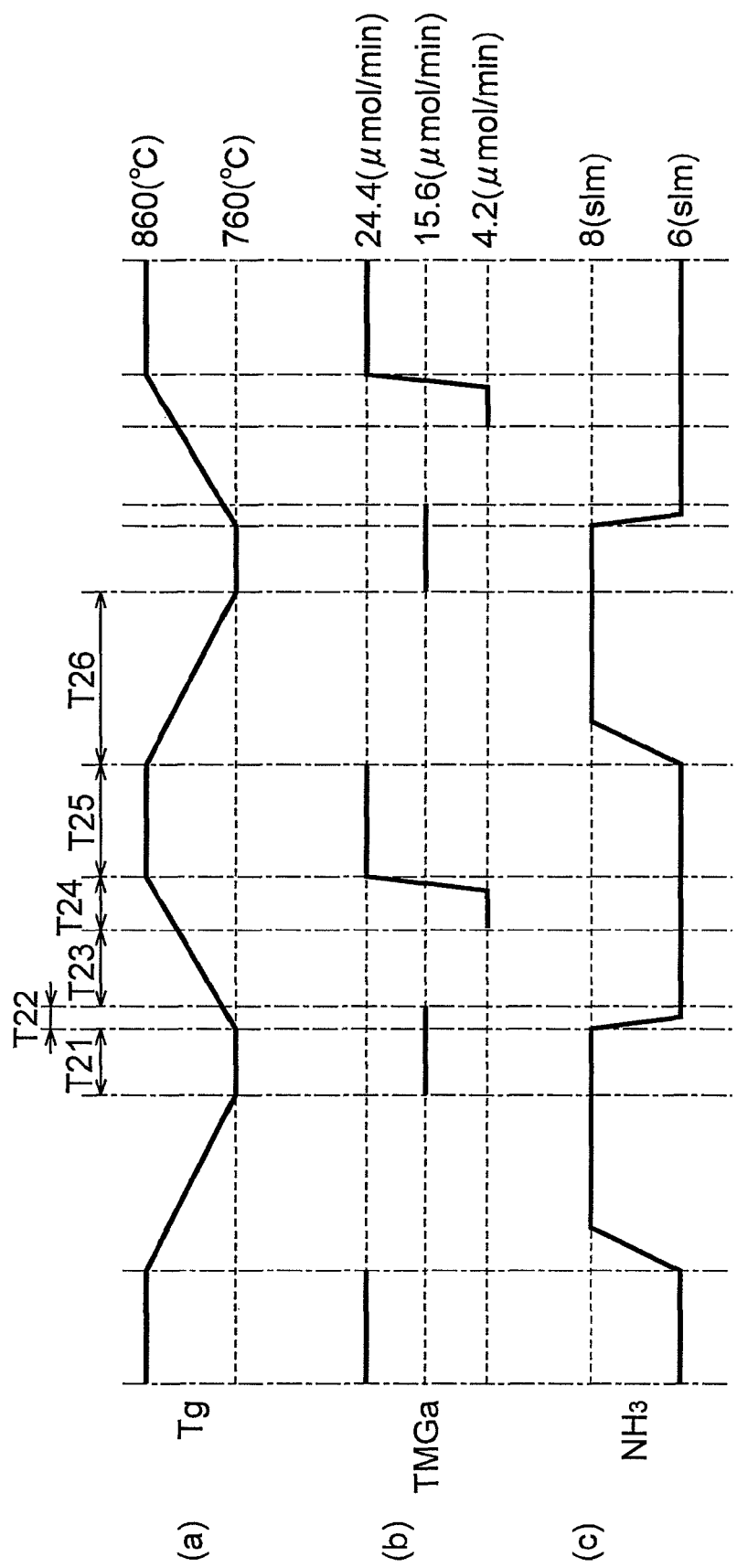
FIG. 13 is a graph showing as follows: change "(a)" of the temperature Tg; change "(b)" of the amount of supplied TMGa; and change "(c)" of the amount of supplied $NH_3$.

FIG. 13 illustrates a method of fabricating a quantum well structure according to a second embodiment. FIG. 13 shows: change "(a)" of the temperature (substrate temperature Tg) of a sapphire substrate 40 in forming an active layer 43 by a method different from that shown in FIG. 5; change "(b)" of the amount of supplied gallium source gas (trimethylgallium: TMGa); and change "(c)" of the amount of supplied nitrogen source gas (ammonia: $NH_3$).

During the time period T21 in FIG. 13, InGaN crystal for a well layer 43a is grown. In the step of growing the well layer 43a, the substrate temperature Tg is kept relatively low, for example, a first temperature of 760° C. In the step of growing the well layer 43a, the flow rate $Q_{Ga}$ of TMGa is 15.6 (micromol/minute), the flow rate $Q_V$ of ammonia ($NH_3$) is 8 (slm), and the flow rate $Q_{In}$ of TMIn is 58.0 (micromol/minute), for example. The growth rate of the well layers 43a is 0.2 micrometers/hour, for example.

Subsequently, during the time period T22, InGaN crystal for a part of an intermediate layer 43c is grown (in a first intermediate layer growth step). In the first intermediate layer growth step, the InGaN crystal is grown on the well layer 43a while the substrate temperature Tg is monotonically increased from the first temperature (e.g., 760° C.) set for the growth of the well layer 43a. In the first intermediate layer growth step, the flow rate $Q_{Ga}$ of TMGa is 15.6 (micromol/minute), the flow rate $Q_V$ of ammonia ($NH_3$) is 6 (slm), and the flow of TMIn is stopped not to supply it. The growth rate of the intermediate layers 43c is lower than that of the barrier layer 43b, which will be described below, and is 0.2 micrometers/hour, for example.

During the time period T23, the growth of the intermediate layer 43c is interrupted (that is, the flow of TMGa and TMIn is stopped not to supply them) while the substrate temperature Tg is monotonically increased subsequent to the first intermediate layer growth step (a temperature rise step). In this temperature rise step, only ammonia ($NH_3$) can be supplied at the flow rate $Q_V$ of 6 (slm), for example.

During the time period T24, subsequent to the temperature rise step, while the substrate temperature Tg is monotonically increased to a relatively high second temperature of, for example, 860° C., and then the remaining part of the intermediate layer 43c is grown (a second intermediate layer growth step). After the first and second intermediate layer growth steps, the intermediate layer 43c has a total thickness greater than 1 nm and less than 3 nm. In the second intermediate layer growth step, the flow rate $Q_{Ga}$ of TMGa is 4.2 (micromol/minute), and the flow rate $Q_V$ of ammonia ($NH_3$) is 6 (slm). The growth rate of the intermediate layers 43c is lower than that of the barrier layer 43b, which will be described later, and is 0.04 micrometers/hour, for example.

During the time period T25, GaN crystal for the barrier layer 43b are grown. In the step of growing the barrier layer 43b, the barrier layer 43b is grown on the intermediate layer 43c while the substrate temperature Tg is kept at the second temperature (860° C.). In the step of growing the barrier layer 43b, the flow rate $Q_{Ga}$ of TMGa is 24.4 (micromol/minute) and the flow rate $Q_V$ of ammonia ($NH_3$) is 6 (slm), while the flow of TMIn is stopped not to supply it. The growth rate of the barrier layer 43b is 0.4 micrometers/hour, for example.

Then, during the time period T26, the substrate temperature Tg is decreased from the second temperature (860° C.) to the first temperature (760° C.). During the temperature fall, the flow of TMGa and TMIn is stopped not to supply them, and only ammonia ($NH_3$) can be supplied at the flow rate of 8 (slm), for example.

As described above, the well layer growth step, the first intermediate layer growth step, the temperature rise step, the second intermediate layer growth step, and the barrier layer growth step are repeated a predetermined number of times, which provides the active layer 43 of the second embodiment. The semiconductor light emitting device 1A can be formed using steps of fabricating the structure of the semiconductor light emitting device as in the first embodiment except for the formation of active layer 43.

The above described method of fabricating a quantum well structure according to the second embodiment includes the first intermediate layer growth step, the temperature rise step, and the second intermediate layer growth step, and the second intermediate layer growth step is between the steps of growing the well layer 43a and the barrier layer 43b. In the first intermediate layer growth step, a part of the intermediate layer 43c is grown while the substrate temperature Tg is monotonously increased from the first temperature (e.g., 760° C.). The part of the intermediate layer 43c can protect the well layer 43a, thereby suppressing the decomposition of crystal of the well layer 43a even when the substrate temperature Tg is increased to the second temperature of 860° C., for example. The remaining part of the intermediate layer 43c is grown at a relatively high temperature in the second intermediate layer growth step after the temperature rise step, so that the crystal qualities of the intermediate layer 43c and the barrier layer 43b formed thereon can be improved. In the method of fabricating a quantum well structure of this embodiment, the intermediate layer 43c is grown to have a thickness of over 1 nm and less than 3 nm as in the first embodiment, which effectively suppresses the decomposition of crystal of the well layer 43c and achieves the emission properties appropriate for the indium content of the well layer 43a.

Third Embodiment

Part (a) of FIG. 14 is a schematic cross sectional view showing the semiconductor light emitting device 1B of a third embodiment according to the present invention. The semiconductor light emitting device 1B may be a light emitting diode of a surface emitting type. The semiconductor light emitting device 1B may be a square device (semiconductor chip) of 400 micrometers×400 micrometers as viewed directly from above in a direction of its thickness. The semiconductor light emitting device 1B includes an n-type gallium nitride based semiconductor layer 23, an active layer 25 having indium-containing group III nitride semiconductor layers, a p-type AlGaN semiconductor layer 27, and a p-type gallium nitride based semiconductor layer 29. The active layer 25 is located on the n-type gallium nitride based semiconductor layer 23. The p-type AlGaN semiconductor layer 27 is located on the active layer 25. The p-type gallium nitride based semiconductor layer 29 is located on the p-type AlGaN semiconductor layer 27. An electrode (e.g., anode) is formed on the p-type gallium nitride based semiconductor layer 29.

The n-type gallium nitride based semiconductor layer 23 functions as a lower cladding layer. The n-type gallium nitride based semiconductor layer 23 may be an n-type GaN semiconductor layer having a thickness of 2000 nm, for example. The p-type AlGaN semiconductor layer 27 functions as an electron blocking layer that reduces leakage of electrons from the active layer 25 to enhance quantum efficiency. The p-type AlGaN semiconductor layer 27 has a thickness of 20 nm, for example. The p-type gallium nitride based semiconductor layer 29 functions as a contact layer for electrical connection to the electrode. The p-type gallium nitride based semiconductor layer 29 may be a p-type GaN semiconductor layer having a thickness of 50 nm, for example.

The semiconductor light emitting device 1B further includes a substrate 35 made of an $In_SAl_TGa_{1-S-T}N$ semiconductor ($0 \leq S \leq 1, 0 \leq T \leq 1, 0 \leq S+T \leq 1$). The substrate 35 may be an n-type GaN substrate in one example. The substrate 35 has a front surface 35a on which an n-type gallium nitride based semiconductor layer 23 is provided, and a back surface on which an electrode (e.g., cathode) is formed.

The active layer 25 has a quantum well structure with well layers 25a and barrier layers 25b. The well layers 25a are composed of an indium-containing group III nitride semiconductor, and may be composed of $In_XGa_{1-X}N$ (0<X<1), for example. The well layers 25a is prepared to have an emission wavelength of 500 nm or more, for example. The barrier layers 25b are composed of a group III nitride semiconductor having a band gap energy larger than that of the well layers 25a, and may be composed of $In_YGa_{1-Y}N$ ($0 \leq Y<1$, Y<X) having less indium content than that of the well layers 25a, for example. The barrier layers 25b may be composed of GaN if necessary. Each well layer 25a has a thickness not larger than 10 nm, and its thickness may be 4 nm, for example. Preferably each barrier layer 25b has a thickness larger than that of the well layer 25a, and its thickness may be 12.5 nm, for example. The active layer 25 emits light through the electrode formed on the p-type gallium nitride based semiconductor layer 29.

The semiconductor light emitting device 1B further includes a gallium nitride layer 31 that is composed of GaN grown under nitrogen atmosphere and, the gallium nitride layer 31 is between the active layer 25 and the p-type AlGaN semiconductor layer 27. The gallium nitride layer 31 has a thickness of 3 nm, for example.

The semiconductor light emitting device 1B further includes an n-type gallium nitride based buffer layer 33 between the n-type gallium nitride based semiconductor layer 23 and the active layer 25. The well layer 25a of InGaN have a c-axis lattice constant larger than the c-axis lattice constant (=0.51851 nm) of GaN used as the n-type gallium nitride based semiconductor layer 23. The semiconductor light emitting device 1B has an n-type gallium nitride based buffer layer 33 to compensate for the difference between the lattice constants of the n-type gallium nitride based semiconductor layer 23 and the active layer 25, which can form the active layer 25 with reduced effect of GaN.

The n-type gallium nitride based buffer layer 33 is preferably composed of InGaN, and may have a thickness of 100 nm. Preferably the growth temperature of InGaN is within the range of from 700° C. to 900° C.

Part (b) of FIG. 14 is a cross sectional view showing the active layer 25 of this embodiment in more detail. As shown in part (b) of FIG. 14, the active layer 25 has a multiple quantum well structure with well layers 25a and barrier layers 25b which are arranged alternately. The active layer 25 further includes intermediate layers 25c between the well layers 25a and the barrier layers 25b. In the active layer 25 of this embodiment, a well layer 25a, an intermediate layer 25c, and a barrier layer 25b are arranged in sequence repeatedly to form a semiconductor laminate. The content of the intermediate layer 25c and the arrangement thereof are similar to those of the intermediate layer 5c of the first embodiment.

Figure 15:
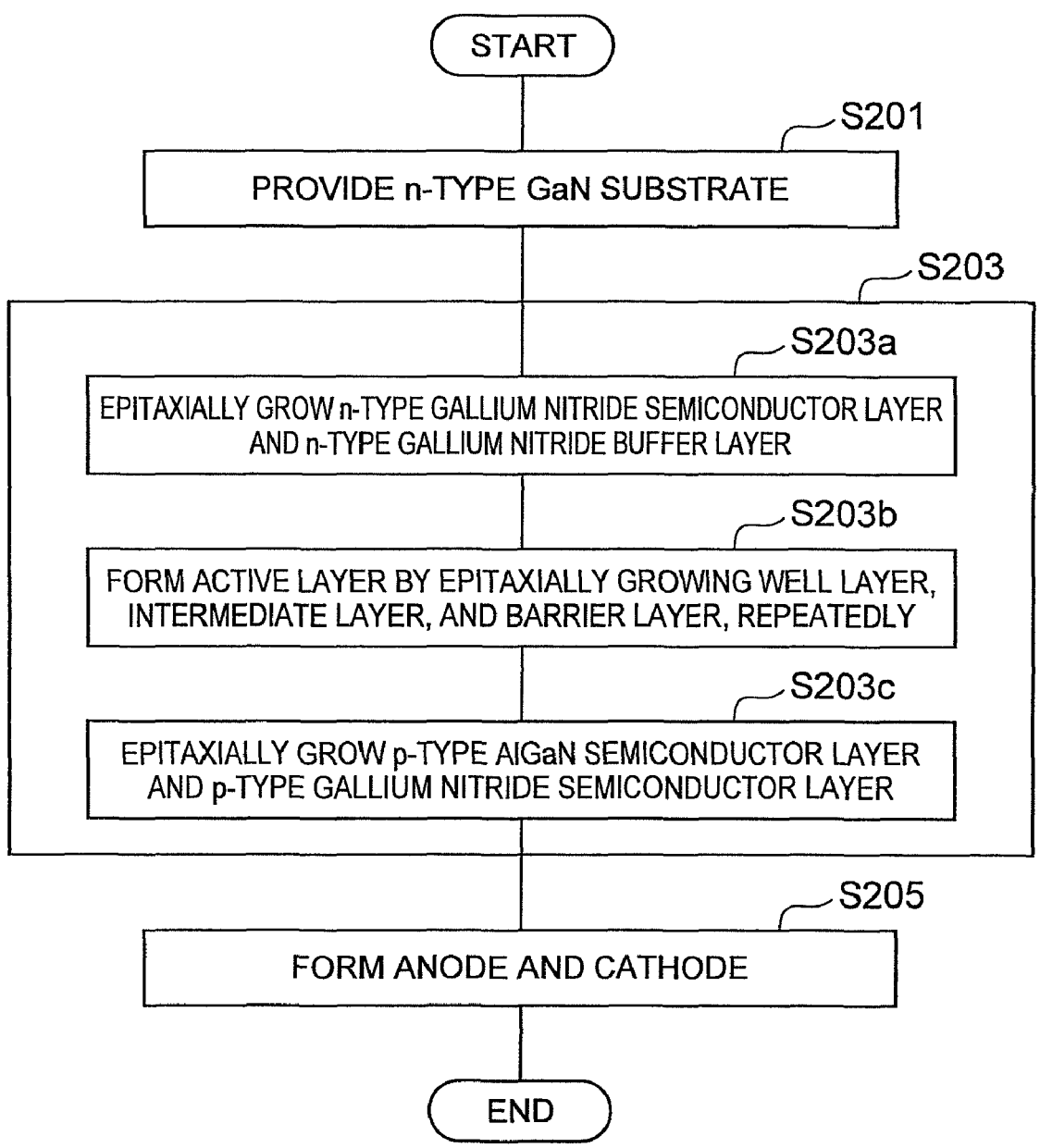
FIG. 15 is a flowchart illustrating the primary steps of a method of fabricating a semiconductor light emitting device according to the third embodiment.

FIG. 15 is a flowchart illustrating the primary steps of a method of fabricating the semiconductor light emitting device 1B according to this embodiment. FIGS. 16 and 17 illustrate steps in FIG. 15. First, at Step S201 in FIG. 15, an n-type GaN substrate 60 having a primary surface 60a is prepared as shown in part (a) of FIG. 16. Next, at Step S203, a substrate product such as an epitaxial wafer is fabricated. At Step S203a, as shown in part (b) of FIG. 16, an n-type gallium nitride based semiconductor layer 61 and an n-type gallium nitride based buffer layer 62 are epitaxially grown on the n-type GaN substrate 60. The n-type gallium nitride based semiconductor layer 61 has a thickness of 2000 nm, and the n-type gallium nitride based buffer layer 62 has a thickness of 100 nm, for example. Preferably the n-type gallium nitride based semiconductor layer 61 is composed of GaN, and the n-type gallium nitride based buffer layer 62 is composed of InGaN.

At Step S203b, as shown in part (a) of FIG. 17, an active layer 63 composed of a group III nitride semiconductor is formed on the n-type gallium nitride based buffer layer 62. In this embodiment, a well layer 63a of $In_XGa_{1-X}N$ (0<X<1), an intermediate layer 63c of $In_ZGa_{1-Z}N$ (0≦Z<1), and a barrier layer 63b of $In_YGa_{1-Y}N$ (0≦Y<1, Y<X) are epitaxially grown on the n-type gallium nitride based buffer layer 62 repeatedly in sequence, to provide the active layer 63. Each well layer 63a has a thickness not greater than 10 nm, and its thickness may be, for example, 4 nm. Each intermediate layer 63c has a thickness greater than 1 nm and less than 3 nm, and its thickness may be, for example, 2.5 nm. Each barrier layer 63b has a thickness, for example, 12.5 nm.

At Step S203c, as shown in part (b) of FIG. 17, a p-type AlGaN semiconductor layer 64 and a p-type gallium nitride based semiconductor layer 65 are epitaxially grown on the active layer 63. The p-type AlGaN semiconductor layer 64 may function as an electron blocking layer, and the p-type gallium nitride based semiconductor layer 65 may function as a contact layer, for example. The p-type AlGaN semiconductor layer 64 has a thickness of 20 nm, and the p-type gallium nitride based semiconductor layer 65 has a thickness of 50 nm, for example. The p-type gallium nitride based semiconductor layer 65 may be composed of GaN, for example. Through these steps, an epitaxial wafer is provided.

At Step S205, an electrode (e.g., anode) is formed on the p-type gallium nitride based semiconductor layer 65 of the epitaxial wafer. The electrode may be composed of Ni/Au, and has an area of $1.6 \times 10^{-3}$ (cm$^2$), for example. The n-type GaN substrate 60 has a back surface on which another electrode (e.g., cathode) is formed. The electrode may be composed of Ti/Al/Au, for example. Finally, the epitaxial wafer is divided into separated semiconductor chips, which correspond to the semiconductor light emitting devices 1B of this embodiment.

Referring to FIG. 18, a specific example of a method of fabricating a quantum well structure of the active layer 63 will be described in more detail below. FIG. 18 shows the following gas flows: change "(a)" of the temperature (substrate temperature Tg) of the n-type GaN substrate 60 in forming the active layer 63; change "(b)" of the amount of supplied TMGa; change "(c)" of the amount of supplied NH$_3$; and change "(d)" of the amount of supplied TMIn.

During the time period T31 in FIG. 18, InGaN crystal for the well layer 63a is grown. In the step of growing the well layer 63a, the substrate temperature Tg is kept a relatively low first temperature of 660° C., for example. Such a low temperature assures an adequate indium content in the InGaN crystal on the n-type GaN substrate 60 with an off-angle. In the step, the flow rate $Q_{Ga}$ of TMGa is 24.4 (micromol/minute), the flow rate $Q_V$ of ammonia (NH$_3$) is 8 (slm), and the flow rate $Q_{In}$ of TMIn is 36.5 (micromol/minute), for example. The growth rate of the well layer 63a is 0.3 micrometers/hour, for example.

During the time period T32, the InGaN crystal for the intermediate layers 63c is grown. In the step of growing the intermediate layers 63c, the InGaN crystal is grown on the well layer 63a while the substrate temperature Tg is monotonically increased from the first temperature (e.g., 660° C.) for the growth of the well layer 63a to the second temperature (e.g., 860° C.) for the growth of the barrier layers 63b. In the step of growing the intermediate layers 63c, the flow rate $Q_{Ga}$ of TMGa is 2.6 (micromol/minute), the flow rate $Q_V$ of ammonia (NH$_3$) is 6 (slm), and the flow rate $Q_{In}$ of TMIn is 0.3 (micromol/minute), for example. The growth rate of the well layers 63c is lower than that of the barrier layer 63b, which will be described below, and may be 0.04 (micrometers/hour), for example.

During the time period T33, InGaN crystal for the barrier layers 63b is grown. In the step of growing the barrier layer 63b, the barrier layer 63b is grown on the intermediate layer 63c while the substrate temperature Tg is kept at a relatively high second temperature of, for example 860° C. In the step of growing the barrier layer 63b, the flow rate $Q_{Ga}$ of TMGa is 24.4 (micromol/minute), and the flow rate $Q_V$ of ammonia (NH$_3$) is 6 (slm), and the flow rate $Q_{In}$ of TMIn is 1.6 (micromol/minute), for example. The growth rate of the barrier layer 63b can be 0.4 (micrometers/hour), for example.

During the time period T34, the substrate temperature Tg is decreased from the second temperature (860° C.) to the first temperature (760° C.). During the temperature fall, the flow of TMGa and TMIn is stopped not to supply them, and only ammonia (NH$_3$) may be supplied at a change rate of 8 (slm), for example.

As described above, the well layer growth step, the intermediate layer growth step, and the barrier layer growth step are repeated a predetermined number of times, which provides the active layer 63 shown in part (a) of FIG. 17.

The above-described method of a quantum well structure according to this embodiment includes the step of growing the intermediate layer 63c, which is located between the steps of growing the well layer 63a and the barrier layer 63b. In the step of growing the intermediate layer 63c, the substrate temperature Tg is monotonically increased from the first temperature (e.g., 660° C.). The intermediate layer 63c protects the well layer 63a in the subsequent step of growing the barrier layer 63b, which suppresses the decomposition of semiconductor crystal of the well layer 63a even when the substrate temperature Tg is increased (to the second temperature of 860° C., for example) in the step of growing the barrier layer 63b. In addition, in the step of growing the intermediate layer 63c, the intermediate layer 63c is grown to be over 1 nm and less than 3 nm in thickness, as in the first embodiment, which suppresses the decomposition of the crystal and achieves the emission properties corresponding to the indium content of the well layer 63a.

A lower substrate temperature Tg (for example, 660° C. in this embodiment) is preferable in fabricating an epitaxial wafer that is used in light emitting devices with emission wavelength of 500 nm or more on the n-type GaN substrate 60 (35) as in this embodiment. A higher temperature in growing the barrier layer 63b (25b), however, tends to cause the decomposition of the crystal structure of the well layer 63a (25a). The method according to this embodiment addresses this problem, and provides an advantage that the reasonable emission properties consistent with the indium content of the well layer 63a (25a) can be achieved by suppressing the decomposition of crystal structure of the well layer 63a (25a).

A method of fabricating a quantum well structure, a quantum well structure, and a semiconductor light emitting device according to the present invention are not limited to the above embodiments, and various modifications can be made. For example, in the above embodiments, a sapphire substrate and a GaN substrate are used as the substrate for semiconductor light emitting devices, but other substrate may be used as well. Furthermore, in the above embodiments, InGaN is used as the well layers, but the well layers of the present invention may be composed of an indium-containing group III nitride semiconductor having any other content.

What is claimed is:

1. A method of fabricating a quantum well structure, the quantum well structure including a well layer and a barrier layer, the method comprising the steps of:

growing the well layer at a first temperature on a substrate, the well layer comprising a group III nitride semiconductor, and the group III nitride semiconductor containing indium as a constituent;

growing an intermediate layer on the well layer while monotonically increasing a substrate temperature from the first temperature, the intermediate layer comprising a group III nitride semiconductor, the group III nitride semiconductor of the intermediate layer having a band gap energy larger than that of the well layer, and a thickness of the intermediate layer being greater than 1 nm and less than 3 nm in thickness; and growing the barrier layer on the intermediate layer while keeping the substrate temperature at a second temperature higher than the first temperature, the barrier layer comprising a group III nitride semiconductor, and the group III nitride semiconductor of the barrier layer having a band gap energy larger than the band gap energy of the well layer.

2. The method according to claim 1, wherein, in the step of growing an intermediate layer, a growth rate of the intermediate layer is smaller than that of the barrier layer.

3. The method according to claim 1, wherein the well layer is prepared to have an emission wavelength of 500 nanometers or more.

4. The method according to claim 1, wherein the substrate comprises $In_SAl_TGa_{1-S-T}N$ semiconductor ($0 \leq S \leq 1$, $0 \leq T \leq 1$, $0 \leq S+T \leq 1$).

5. A method of fabricating a quantum well structure, the quantum well structure including a well layer and a barrier layer, the method comprising the steps of:

growing the well layer on a substrate while keeping a substrate temperature at a first temperature, the well layer comprising a group III nitride semiconductor, and the group III nitride semiconductor containing indium as a constituent;

growing a first portion of an intermediate layer on the well layer while monotonically increasing the substrate temperature from the first temperature, the first portion of the intermediate layer comprising a group III nitride semiconductor, and the group III nitride semiconductor of the first portion of having a band gap energy larger than that of the well layer;

after interrupting the growth of the intermediate layer, increasing the substrate temperature without semiconductor growth following the growth of the first portion of the intermediate layer;

after increasing the substrate temperature without semiconductor growth, growing a second portion of the intermediate layer on the first portion of the intermediate layer while increasing the substrate temperature to a second temperature higher than the first temperature, a thickness of the intermediate layer being greater than 1 nm and less than 3 nm in total thickness; and growing the barrier layer on the second portion of the intermediate layer while keeping the substrate temperature at the second temperature, the barrier layer comprising a group III nitride semiconductor, and the group III nitride semiconductor of the barrier layer having a band gap energy larger than that of the well layer.

6. The method according to claim 5, wherein, in the step of growing a second portion of the intermediate layer, a growth rate of the second portion of the intermediate layer is smaller than that of the barrier layer.

7. The method according to claim 5, wherein the well layer is prepared to have an emission wavelength of 500 nanometers or more.

8. The method according to claim 5, wherein the substrate comprises $In_SAl_TGa_{1-S-T}N$ semiconductor ($0 \leq S \leq 1$, $0 \leq T \leq 1$, $0 \leq S+T \leq 1$).

* * * * *